(12) United States Patent
Huang et al.

(10) Patent No.: US 12,336,215 B2
(45) Date of Patent: Jun. 17, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Lin-Yu Huang, Hsinchu (TW); Sheng-Tsung Wang, Hsinchu (TW); Li-Zhen Yu, New Taipei (TW); Huan-Chieh Su, Tianzhong Township, Changhua County (TW); Cheng-Chi Chuang, New Taipei (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 950 days.

(21) Appl. No.: 17/469,499

(22) Filed: Sep. 8, 2021

(65) Prior Publication Data

US 2022/0399461 A1 Dec. 15, 2022

Related U.S. Application Data

(60) Provisional application No. 63/209,559, filed on Jun. 11, 2021.

(51) Int. Cl.
*H10D 30/62* (2025.01)
*H10D 30/01* (2025.01)
(Continued)

(52) U.S. Cl.
CPC ....... *H10D 30/6211* (2025.01); *H10D 30/024* (2025.01); *H10D 30/6219* (2025.01);
(Continued)

(58) Field of Classification Search
CPC ........ H01L 29/7851; H01L 21/823418; H01L 21/823431; H01L 21/823481; H01L 27/0886; H01L 29/41791; H01L 29/66795
See application file for complete search history.

(56) References Cited

U.S. PATENT DOCUMENTS

| 2018/0190653 A1* | 7/2018 | Lu .......................... H01L 29/165 |
| 2019/0148225 A1* | 5/2019 | Chen ................. H01L 29/66795 257/384 |

(Continued)

FOREIGN PATENT DOCUMENTS

| KR | 10-2020-0050351 A | 5/2020 |
| KR | 10-2021-0065838 A | 6/2021 |

*Primary Examiner* — Earl N Taylor
(74) *Attorney, Agent, or Firm* — Birch, Stewart, Kolasch & Birch, LLP

(57) ABSTRACT

A semiconductor device structure is provided. The semiconductor device structure includes a fin structure formed over a substrate, and a gate structure formed over the fin structure. The semiconductor device structure includes a first source/drain (S/D) structure formed adjacent to the gate structure, and a first S/D contact structure formed over the first S/D structure. The semiconductor device structure includes a first filling layer formed over the first S/D structure, and the first S/D contact structure is surrounded by the first filling layer. The semiconductor device structure includes a dielectric layer formed adjacent to the gate structure and the first filling layer, and the dielectric layer and the first filling layer are made of different materials. The first filling layer is surrounded by the dielectric layer.

20 Claims, 41 Drawing Sheets

(51) Int. Cl.
*H10D 84/01* (2025.01)
*H10D 84/03* (2025.01)
*H10D 84/83* (2025.01)

(52) U.S. Cl.
CPC ....... *H10D 84/013* (2025.01); *H10D 84/0151* (2025.01); *H10D 84/0158* (2025.01); *H10D 84/038* (2025.01); *H10D 84/834* (2025.01)

(56) References Cited

U.S. PATENT DOCUMENTS

| | | | |
|---|---|---|---|
| 2020/0135546 A1* | 4/2020 | Wang | H01L 21/02532 |
| 2021/0083118 A1* | 3/2021 | Wu | H01L 29/401 |
| 2021/0159326 A1* | 5/2021 | Hsiao | H01L 21/28556 |
| 2021/0175119 A1* | 6/2021 | Huang | H01L 21/76829 |
| 2022/0310815 A1* | 9/2022 | Lee | H01L 23/485 |
| 2023/0230884 A1* | 7/2023 | Huang | H01L 27/0886 |
| | | | 257/401 |
| 2023/0361116 A1* | 11/2023 | Lu | H01L 27/0886 |

* cited by examiner

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 63/209,559, filed on Jun. 11, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
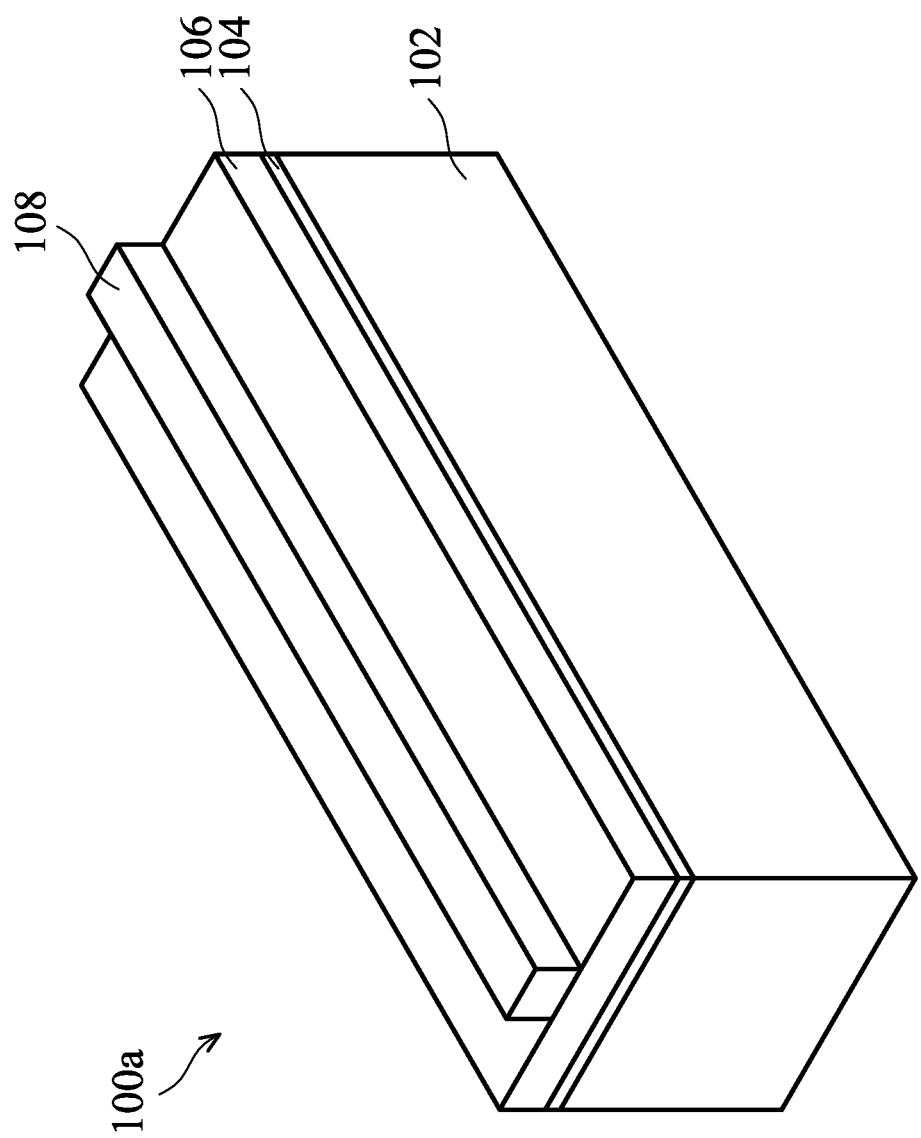
FIGS. 1A-1I show perspective representations of various stages of forming a FinFET device structure, in accordance with some embodiments of the disclosure

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a semiconductor device structure are provided. A filling layer is formed to surround a S/D contact structure, and an ILD layer surrounds the filling layer. The filling layer is different from the ILD layer to provide a higher etching selectivity. Therefore, the hard mask loss is prevented and the leakage issue is reduced. The filling layer of the disclosure can be used in a FinFET device structure or a gate-all-around (GAA) structure.

FIGS. 1A-1I show perspective representations of various stages of forming a FinFET device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed using a deposition process, such as a chemical vapor deposition (CVD) process, a high-density plasma chemical vapor deposition (HDPCVD) process, a spin-on process, a sputtering process, or another applicable process.

Figure 1B:
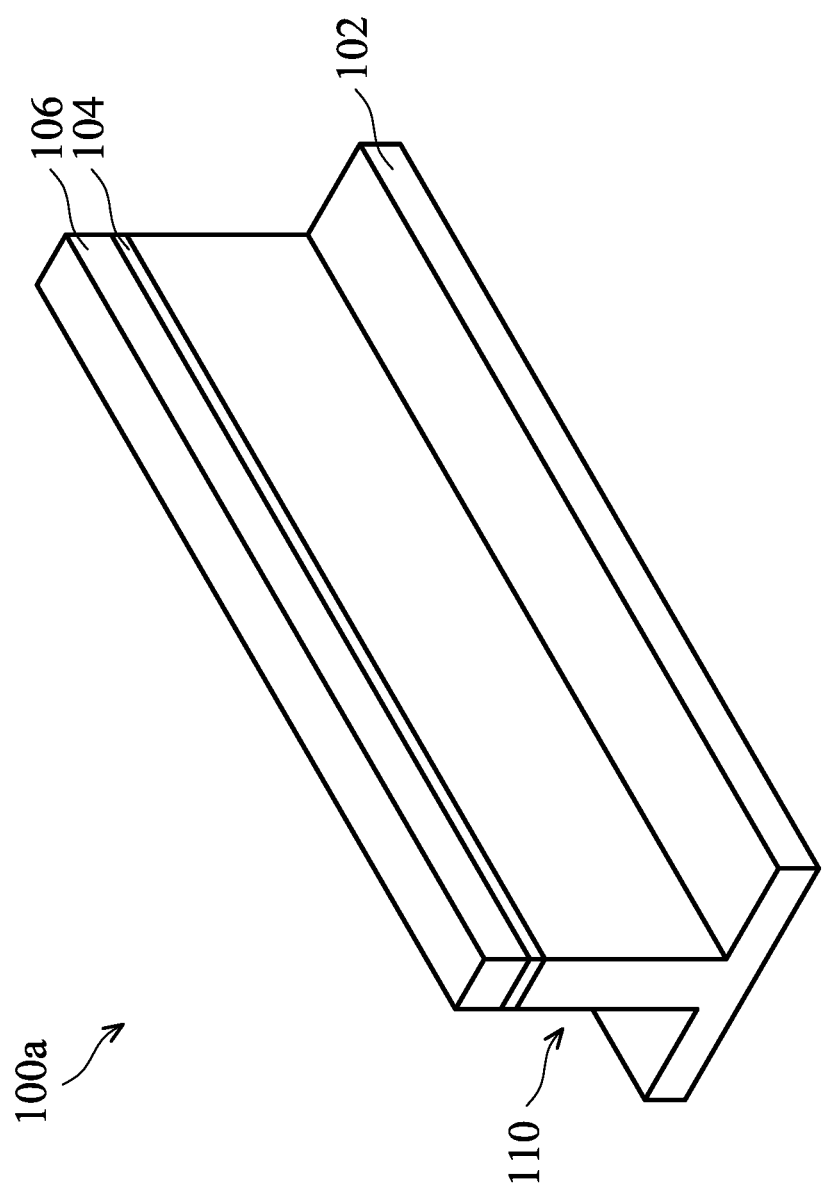

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
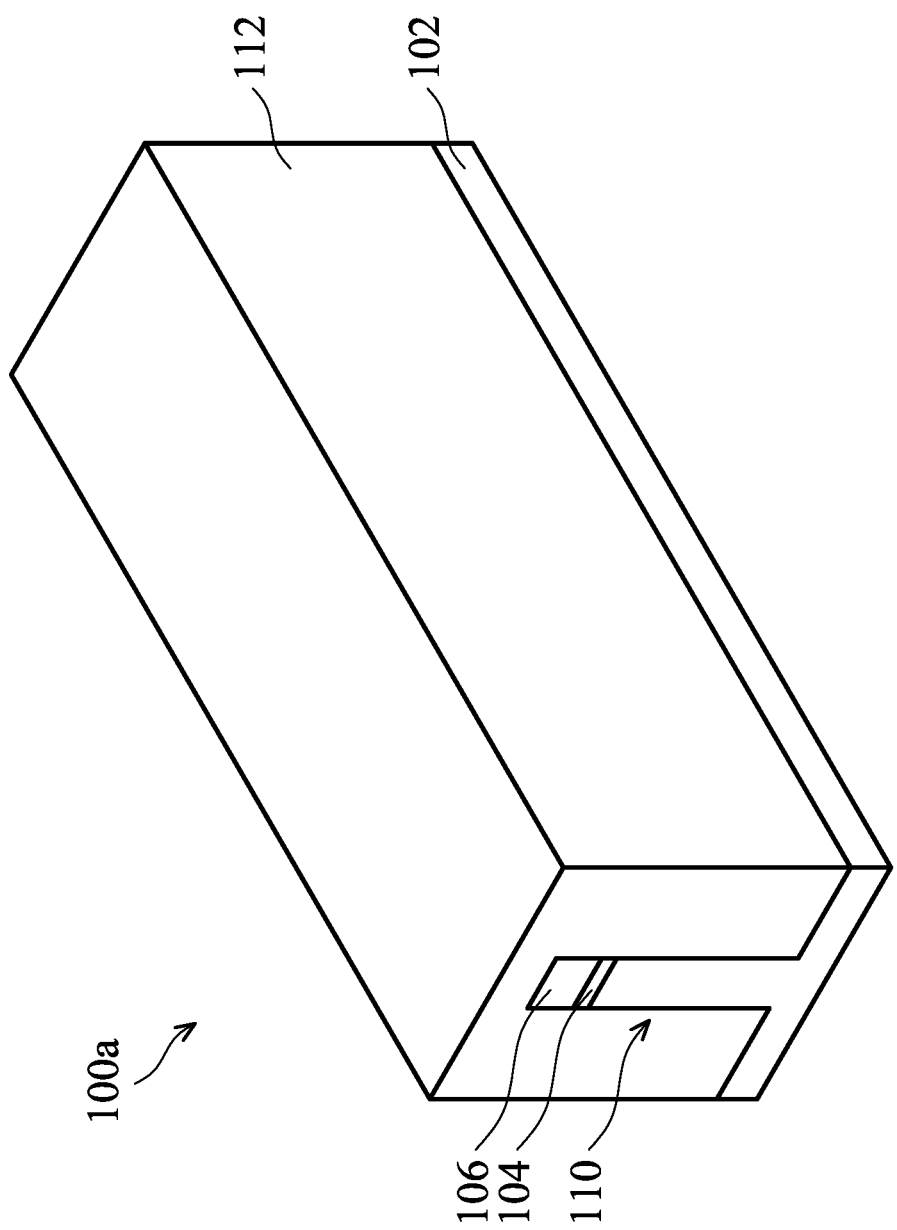

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), low-k dielectric material or another applicable material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process.

Figure 1D:
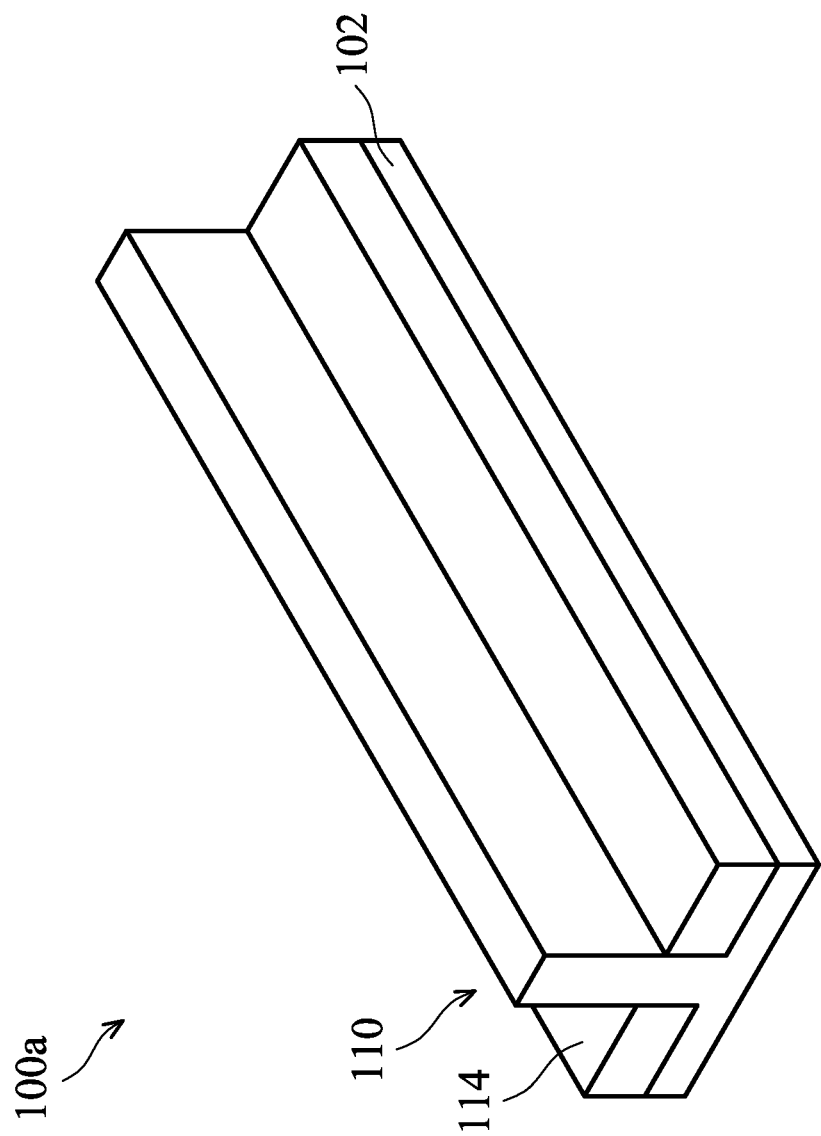

Afterwards, as shown in FIG. 1D, the patterned dielectric layer 104 and the patterned mask layer 106, and a portion of the insulating layer 112 is removed by an etching process, in accordance with some embodiments. As a result, an isolation structure 114 is obtained. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
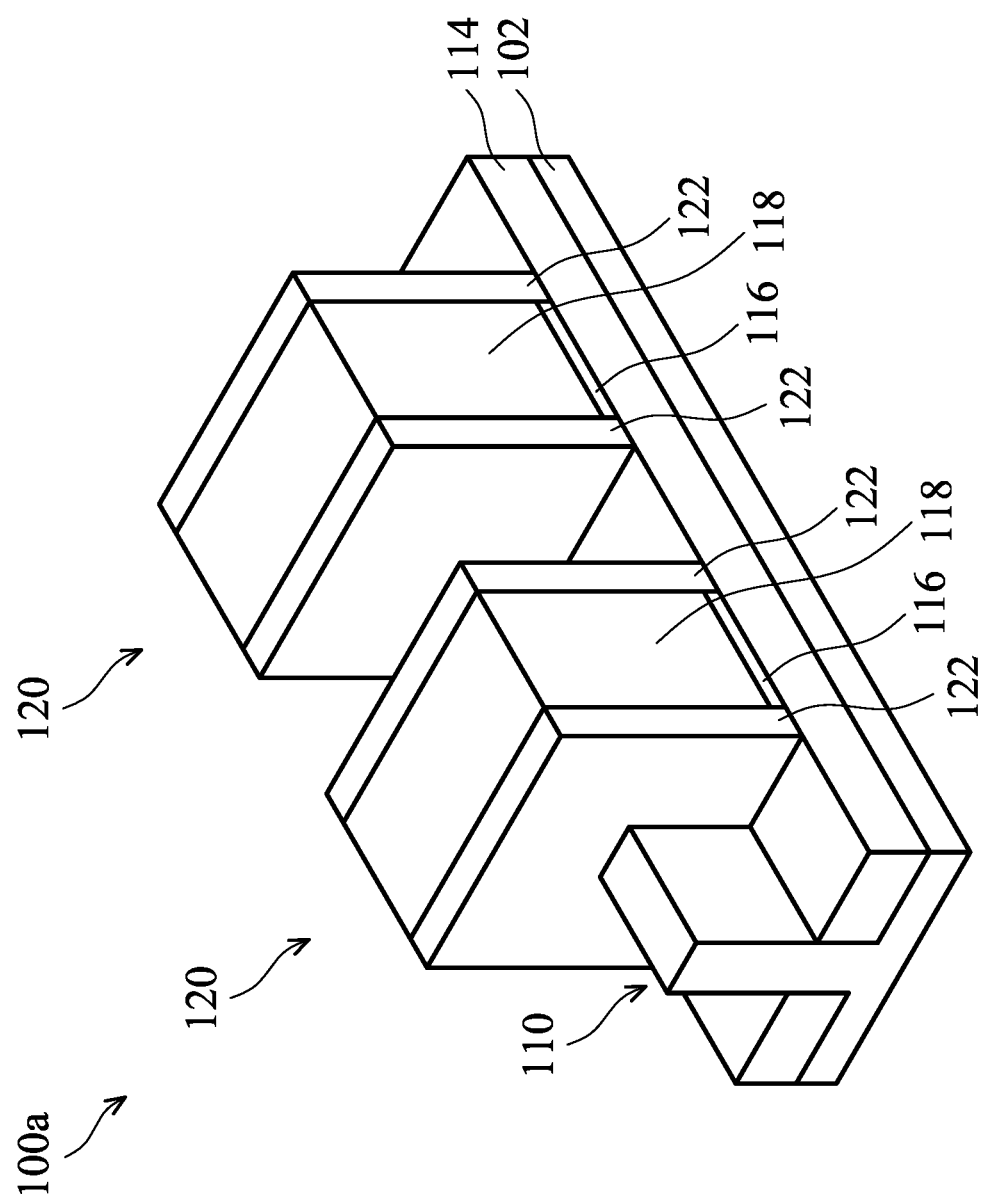

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. In some embodiments, the dummy gate dielectric layer 116 includes silicon oxide, and the dummy gate electrode layer 118 includes polysilicon. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100a, the gate spacer layers 122 are made of low-k dielectric materials. In some embodiments, the low-k dielectric materials has a dielectric constant (k value) less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

Figure 1F:
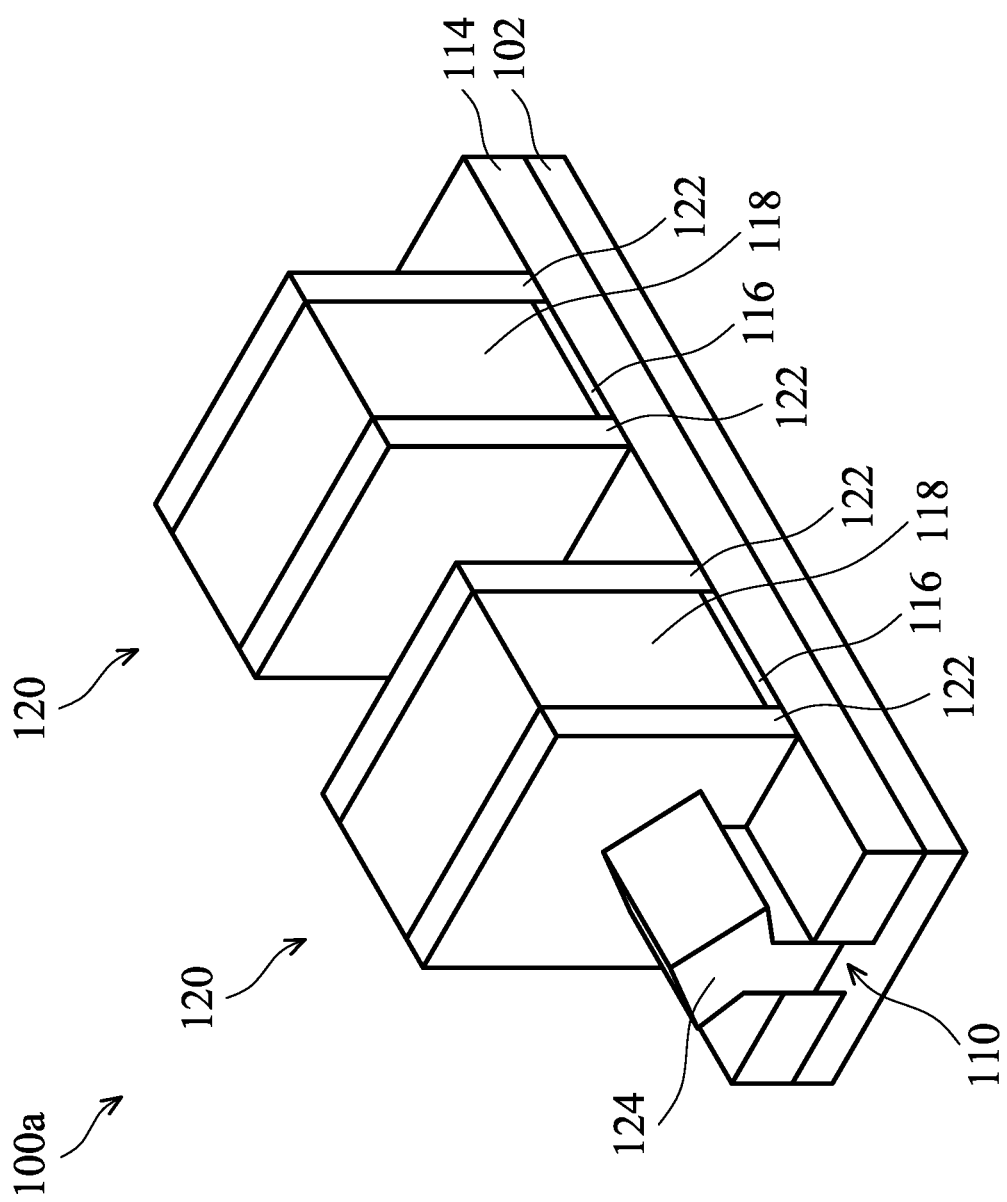

Afterwards, as shown in FIG. 1F, the source/drain (S/D) structures 124 are formed over the fin structure 110, in accordance with some embodiments. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

Figure 1G:
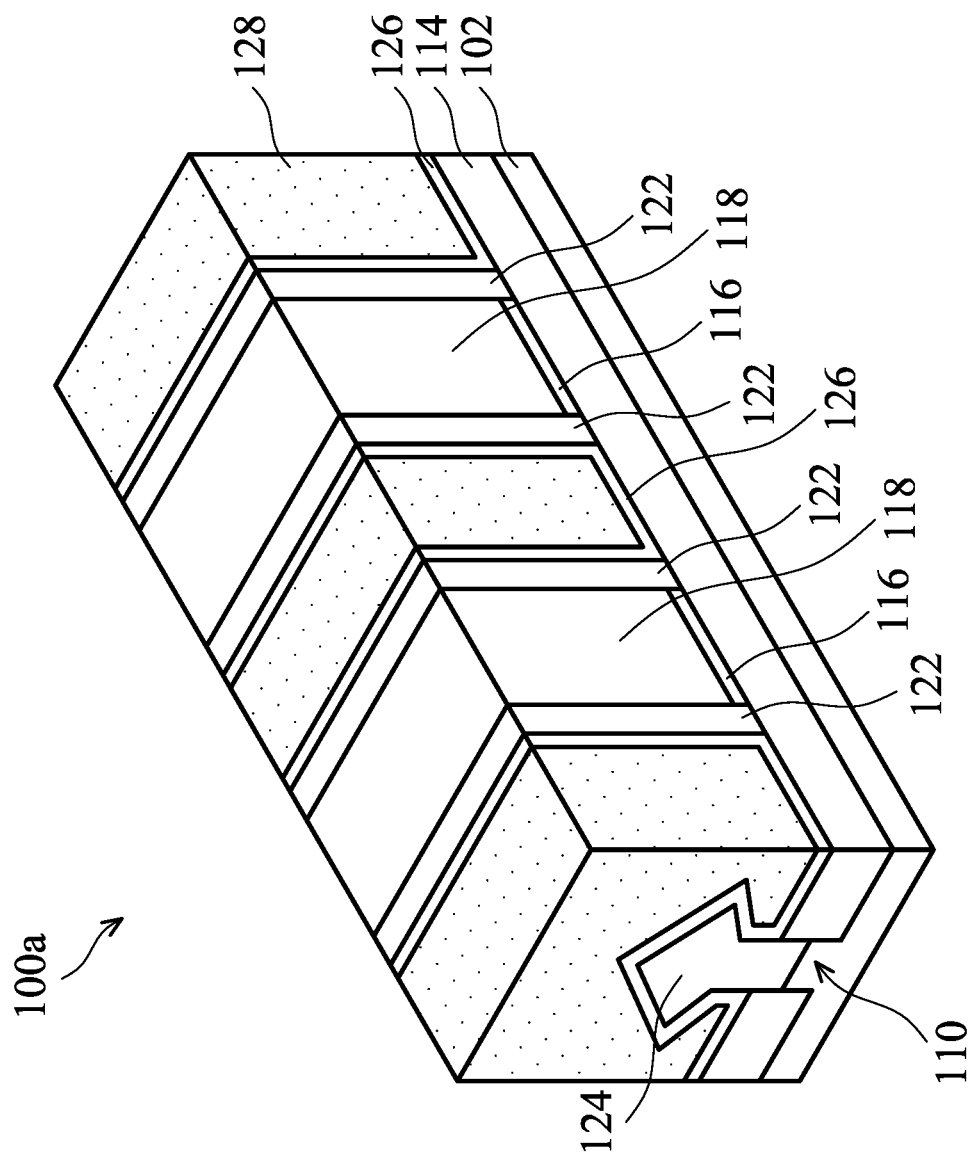

Afterwards, as shown in FIG. 1G, a contact etch stop layer (CESL) 126 is formed over the substrate 102, and a first inter-layer dielectric (ILD) layer 128 is formed over the CESL 126, in accordance with some embodiments. In some other embodiments, the CESL 126 is made of silicon nitride, silicon oxynitride, and/or other applicable materials. The CESL 126 may be formed using plasma enhanced CVD, low-pressure CVD, ALD, or another applicable process. In some embodiments, the CESL has a thickness in a range from about 2 nm to about 10 nm.

The first ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD layer 128 may be formed using chemical vapor deposition (CVD), physical vapor deposition, (PVD), atomic layer deposition (ALD), spin-on coating, or another applicable process.

Afterwards, a polishing process is performed on the first ILD layer 128 until the top surface of the dummy gate structure 120 is exposed. In some embodiments, the first ILD layer 128 is planarized by a chemical mechanical polishing (CMP) process.

Figure 1H:
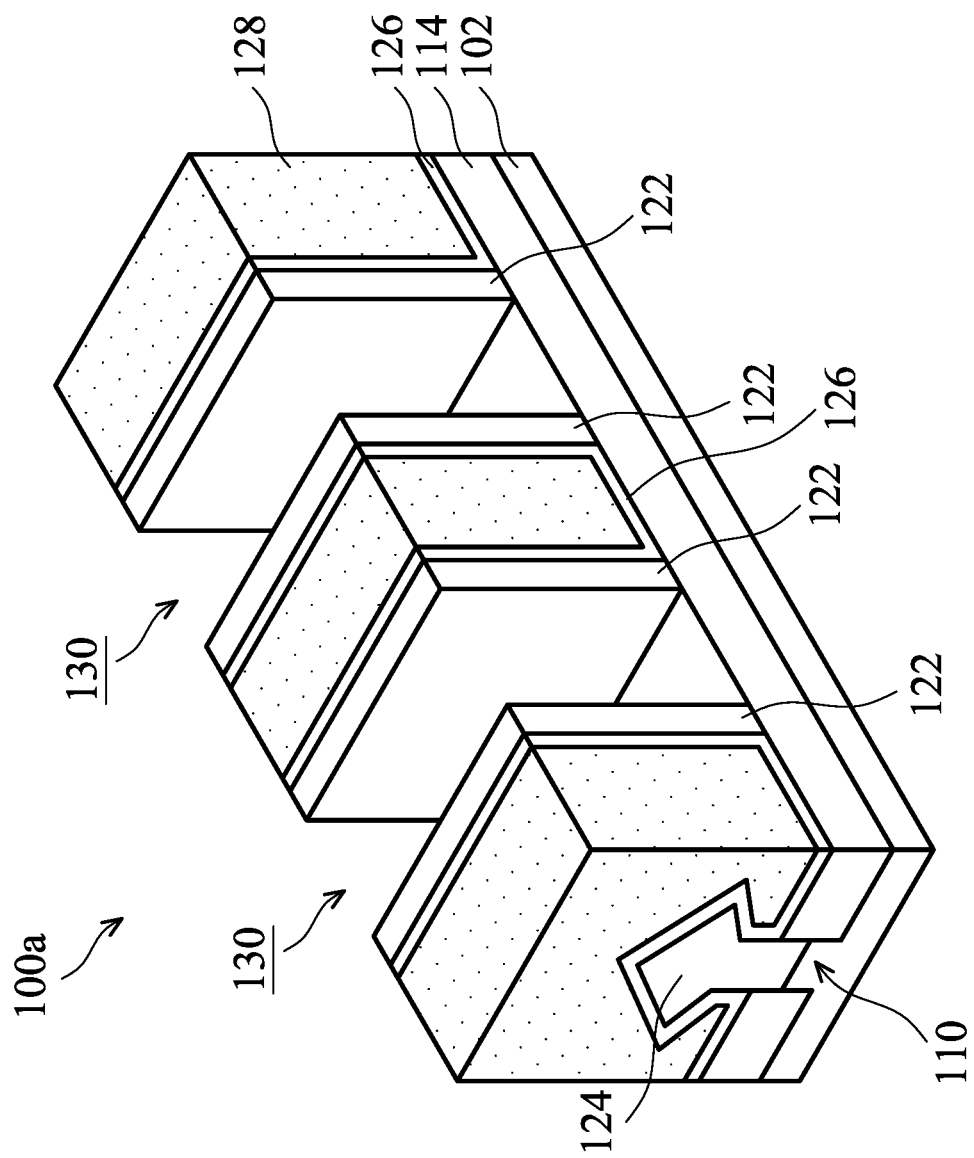

Afterwards, as shown in FIG. 1H, the dummy gate structure 120 is removed to form a trench 130 in the first ILD layer 128, in accordance with some embodiments. The dummy gate dielectric layer 116 and the dummy gate electrode layer 118 are removed by an etching process, such as a dry etching process or a wet etching process.

Figure 1I:
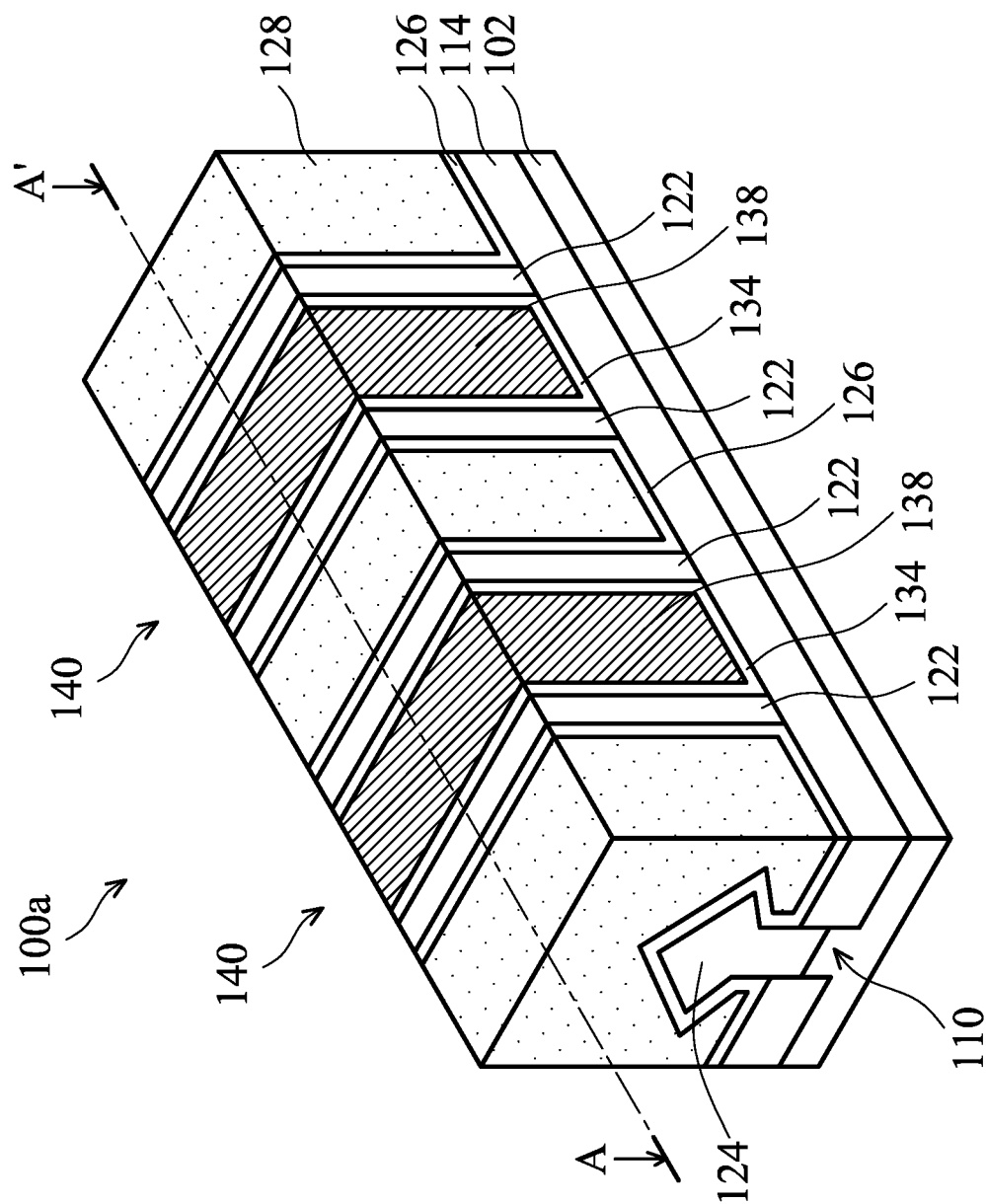

Next, as shown in FIG. 1I, a gate structure 140 is formed in the trench 130, in accordance with some embodiments. The gate structure 140 includes a gate dielectric layer 134 and a gate electrode layer 138.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials.

In some embodiments, the gate structure 140 further includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed using a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 2A:
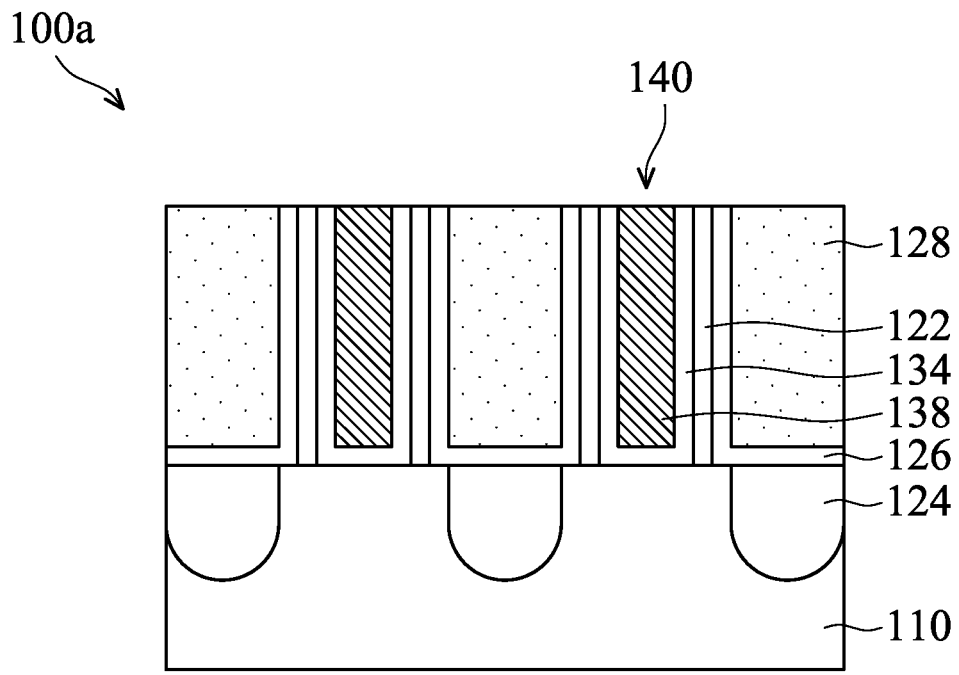
FIGS. 2A-2E show cross-sectional representations of various stages of forming the FinFET device structure after the structure of FIG. 1I, in accordance with some embodiments of the disclosure.

FIGS. 2A-2E show cross-sectional representations of various stages of forming the FinFET device structure 100a after the structure of FIG. 1I, in accordance with some embodiments of the disclosure. FIG. 2A is a cross-sectional representation taken along line A-A' of FIG. 1I.

As shown in FIG. 2A, the gate structure 140 including the gate dielectric layer 134 and the gate electrode layer 138 is formed over the fin 110. The gate spacer layers 122 are formed on opposite sidewalls of the gate structure 140. The CESL 126 is formed adjacent to the gate spacer layers 122.

Figure 2B:
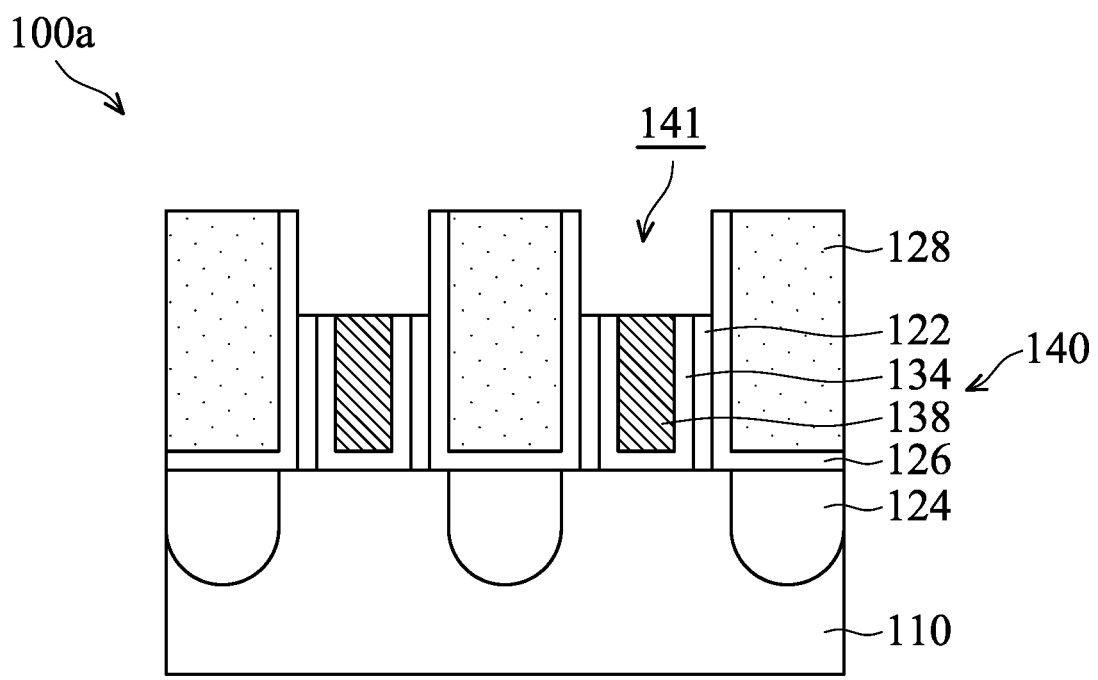

Afterwards, as shown in FIG. 2B, a portion of the gate structure 140 and a portion of the gate spacer layers 122 are removed, in accordance with some embodiments. As a result, a trench 141 is formed over the gate structure 140 and the gate spacer layers 122. The sidewall of the CESL 126, the top surface of the gate structure 140 and the top surface of the gate spacer layer 122 are exposed by the trench 141.

Figure 2C:
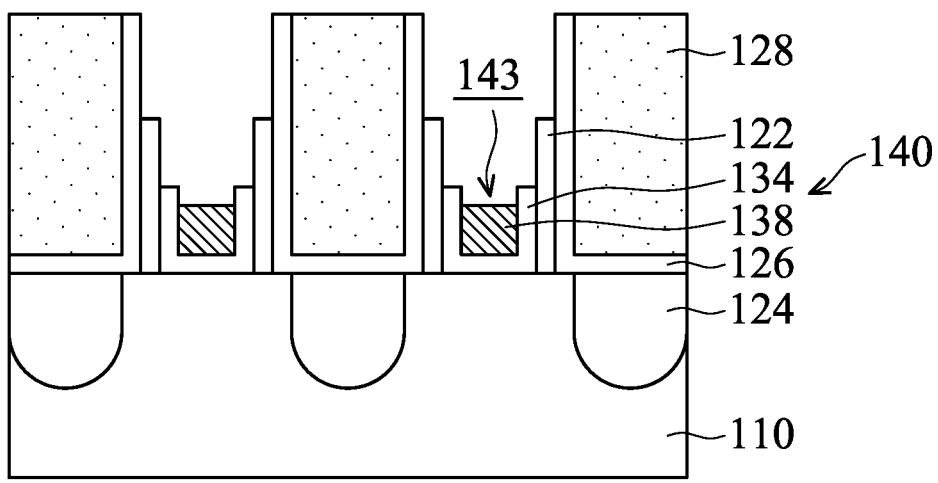

Next, as shown in FIG. 2C, a portion of the gate dielectric layer 134 and a portion of the gate electrode layer 138 of the gate structure 140 is removed, in accordance with some embodiments. Afterwards, a portion of the top portion of the gate electrode layer 138 is removed to form a recess 143 over the gate electrode layer 138. The top surface of the gate electrode layer 138 of the gate structure 140 is lower than the top surface of the gate spacer layers 122 and the top surface of the gate dielectric layer 134.

Figure 2D:
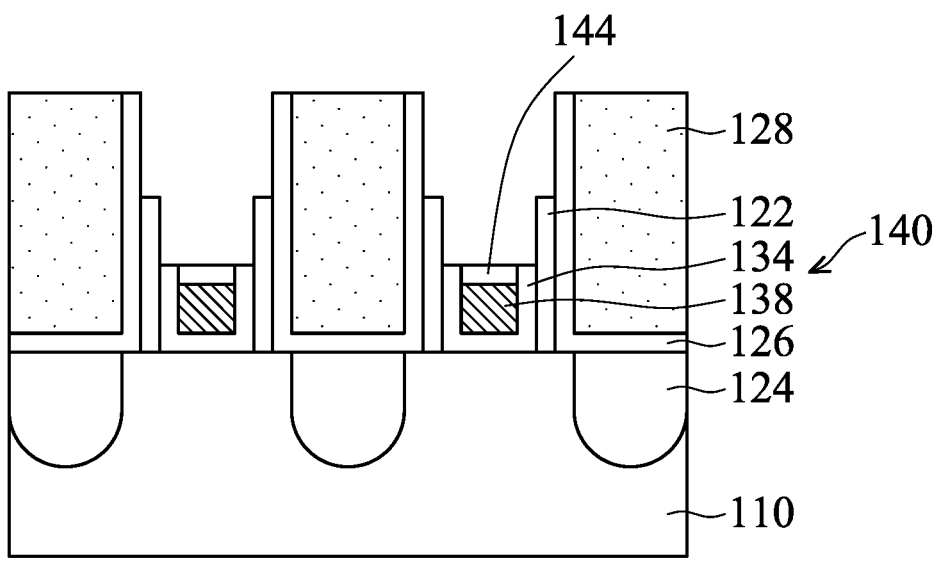

Next, as shown in FIG. 2D, a protection layer 144 is formed on the top surface of the gate structure 140 and in the recess 143, in accordance with some embodiments. The protection layer 144 is used to protect the underlying layers from being polluted or damaged. In some embodiments, the protection layer 144 is selectively formed on the top surface of the gate electrode layer 138, not on the gate dielectric layer 134. The top surface of the protection layer 144 is substantially coplanar with the top surface of the gate dielectric layer 134. The top surface of the protection layer 144 is lower than the top surface of the gate spacer layers 122.

In some embodiments, the protection layer 144 is not formed on the gate dielectric layer 134. In some other embodiments, the protection layer 144 extends from the top surface of the gate electrode layer 138 to the top surface of the gate dielectric layer 134 when the protection layer 144 is deposited more than determined amount. In some embodiments, the protection layer 144 has a thickness in a range from about 1 nm to about 10 nm.

In some embodiments, the protection layer 144 is formed using a deposition process, and the deposition process includes supplying a precursor on the top surface of the first gate structure 140a and the second gate structure 140b. Before the deposition process, a surface treatment process is used to activate the top surface of the gate electrode layer 138. In some embodiments, the surface treatment process includes using hydrogen ($H_2$) gas. When hydrogen ($H_2$) gas is used, hydrogen radicals are formed on the top surface of the gate electrode layer 138. The hydrogen radicals are selectively formed on the top surface of the gate electrode layer 138 to facilitate the formation of the protection layer 144.

The precursor used in the deposition process may include tungsten (W)-containing material, such as tungsten hexafluoride ($WF_6$) or tungsten hexachloride ($WCl_6$). The precursor reacts with the hydrogen radicals to form the protection layer 144 on the gate electrode layer 138. In some embodiments, the protection layer 144 is made of a conductive material, such as tungsten (W). The protection layer 144 is electrically connected to the gate electrode layer 138 of the gate structure 140.

It should be noted that, the protection layer 144 is selectively formed on the gate structure 140, no additional mask layer is used to define the location of the protection layer 144, and the alignment of the protection layer 144 become more easily. The protection layer 144 is not formed in the photolithography process. Therefore, the fabrication time and cost are reduced.

Figure 2E:
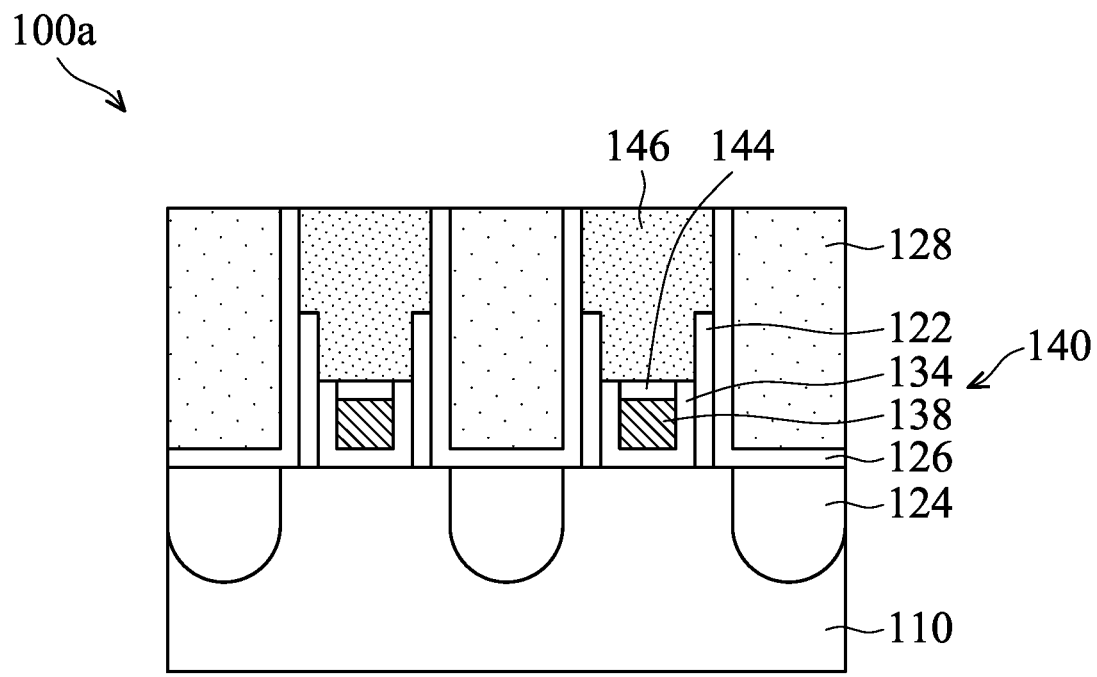

Afterwards, as shown in FIG. 2E, a hard mask layer 146 is formed on the protection layer 144, the CESL 126 and the first ILD layer 128, in accordance with some embodiments. In some embodiments, the hard mask layer 146 has a T-shaped structure.

The hard mask layer 146 and the first ILD layer 128 are made of different materials. In some embodiments, the hard mask layer 146 has a higher etching selectivity with respect to the first ILD layer 128 to protect the underlying gate structure 140.

In some embodiments, the hard mask layer 146 has a dielectric constant which is greater than the dielectric constant of the first ILD layer 128. In some embodiments, the hard mask layer 146 is made of silicon nitride, silicon oxynitride, amorphous carbon material, silicon carbide, LaO, AlO, YO, TaCN, ZrSi, SiOCN, SiOC, SiCN, LaO, ZrN, ZrAlO, TiO, TaO, ZrO, HfO, SiN, HfSi, AlON, ZnO, the other suitable nitrogen-containing materials, other suitable dielectric materials, and/or combinations thereof. In some embodiments, the hard mask layer 146 is formed using a deposition process, such as an atomic layer deposition (ALD) process, a chemical vapor deposition (CVD) process, a physical vapor deposition (PVD) process, or another applicable process.

Figure 3:
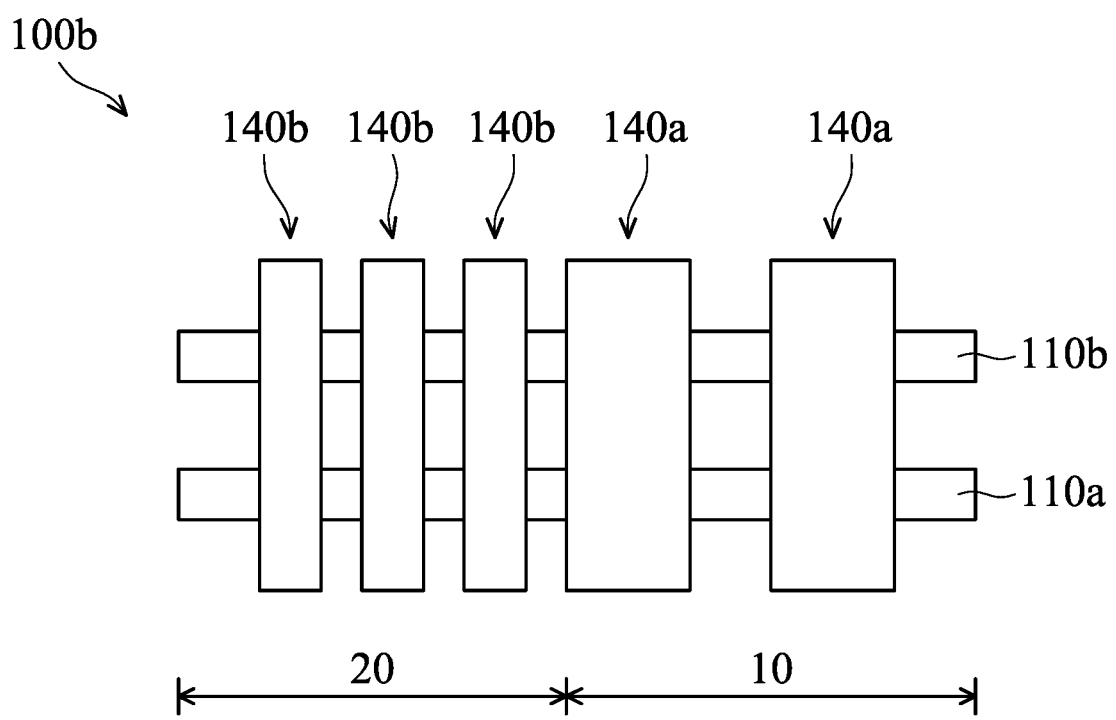
FIG. 3 shows a top view of a FinFET device structure, in accordance with some embodiments of the disclosure.

FIG. 3 shows a top view of a FinFET device structure 100b, in accordance with some embodiments of the disclosure.

FIG. 3 shows two first gate structures 140a and three second gate structures 140b formed over the fin structures 110a and 110b. The first gate structures 140a are formed in the first region 10, and the second gate structures 140b are formed in the second region 20. The width of the first gate structure 140a is greater than the width of the second gate structure 140b. The CESL 126 (not shown in FIG. 3) and first ILD layer 128 (not shown in FIG. 3) surrounds the first gate structures 140a and three second gate structures 140b.

FIGS. 4A-4H show top views of various stages of forming the FinFET device structure 100b, in accordance with some embodiments of the disclosure. FIG. 5A-5H show a cross-sectional representations taken along line BB' of FIGS. 4A-4H.

Figure 4A:
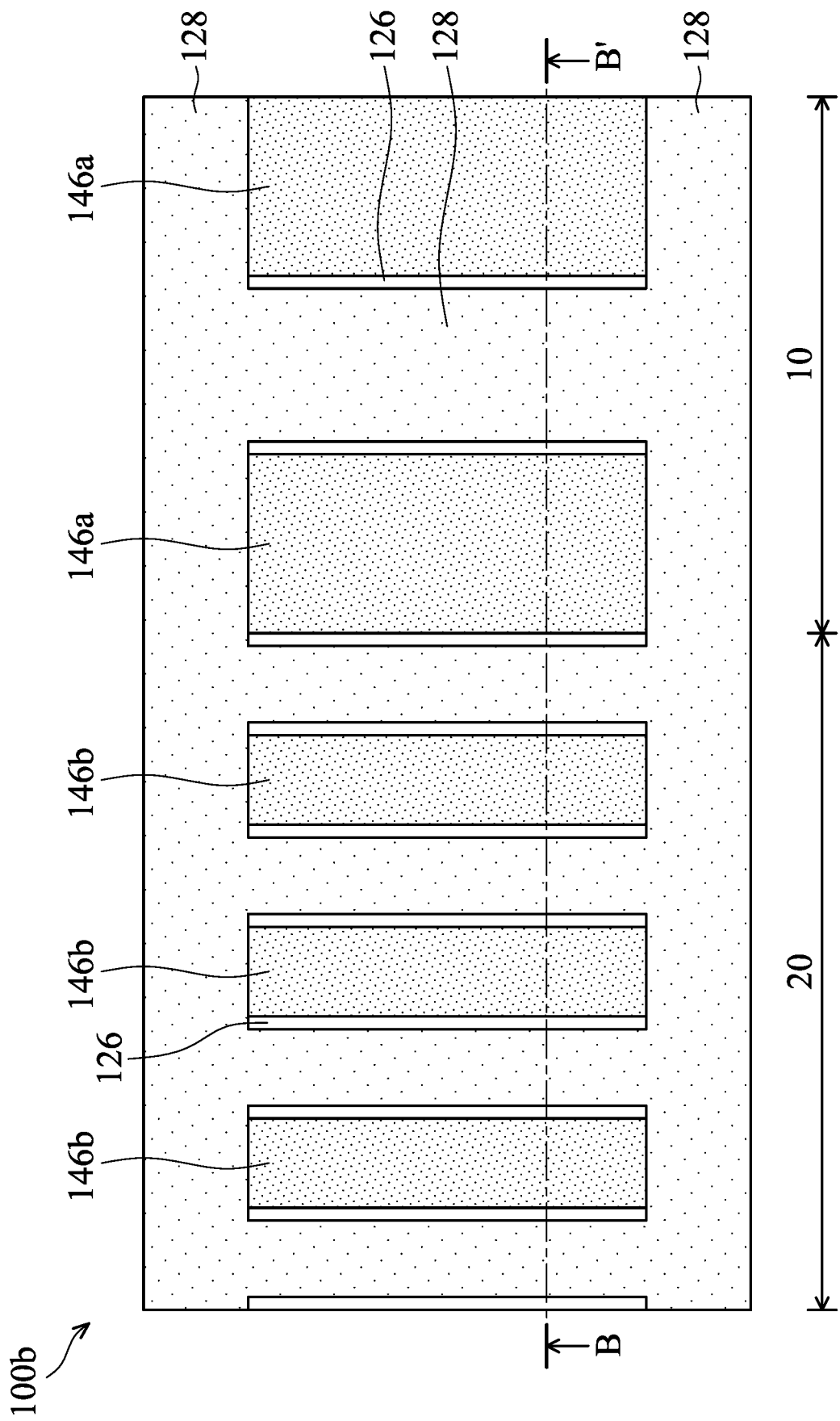
FIGS. 4A-4H show top views of various stages of forming the FinFET device structure, in accordance with some embodiments of the disclosure.
Figure 5A:
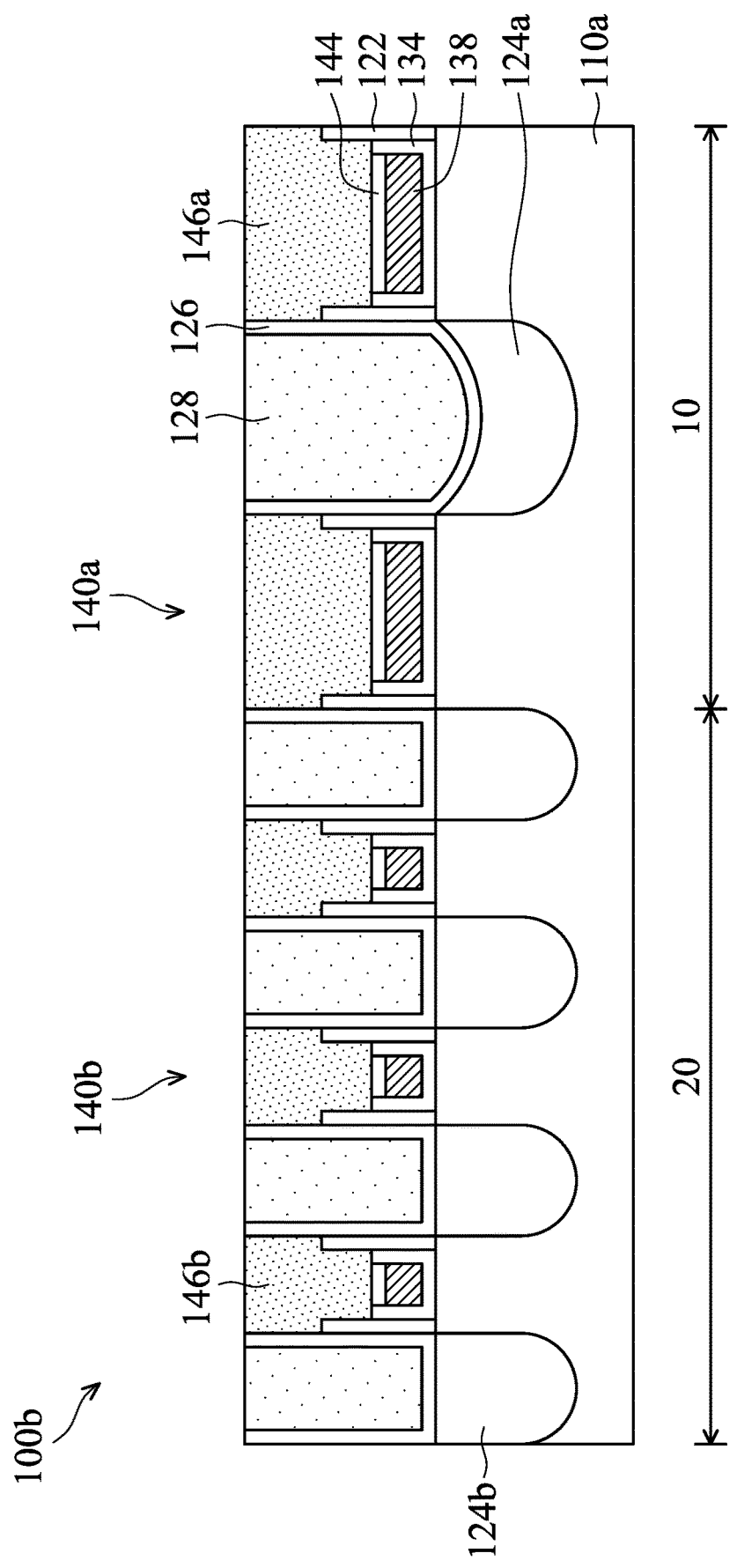
FIG. 5A-5H show a cross-sectional representations taken along line BB' of FIGS. 4A-4H.

As shown in FIGS. 4A and 5A, the substrate 102 includes the first region 10 and the second region 20. The first gate structure 140a is formed over the first region 10, and the second gate structure 140b is formed over the second region 20. The first hard mask layer 146a is formed over the first gate structure 140a, and the second hard mask layer 146b is formed over the second gate structure 140b. The width of the first hard mask layer 146a is greater than the width of the second hard mask layer 146b. The first hard mask layer 146a and the second hard mask layer 146b both have a T-shaped structure.

The first S/D structure 124a is formed over the first region 10, and the second S/D structure 124b is formed over the second region 20. The width of the first S/D structure 124a is greater than the width of the second S/D structure 124b. The top surface of the first S/D structure 124a is recessed, and the top surface of the first S/D structure 124a is lower than the top surface of the second S/D structure 124b.

The top surface of the gate spacer layer 122 is higher than the top surface of the first gate structure 140a and the top surface of the second gate structure 140b. In addition, the top surface of the gate spacer layer 122 is higher than the top surface of protection layer 144. The top surface of the CESL 126 is higher than the top surface of the first gate structure 140a and the top surface of the second gate structure 140b. Furthermore, the top surface of the CESL 126 is higher than the top surface of the protection layer 144.

Figure 4B:
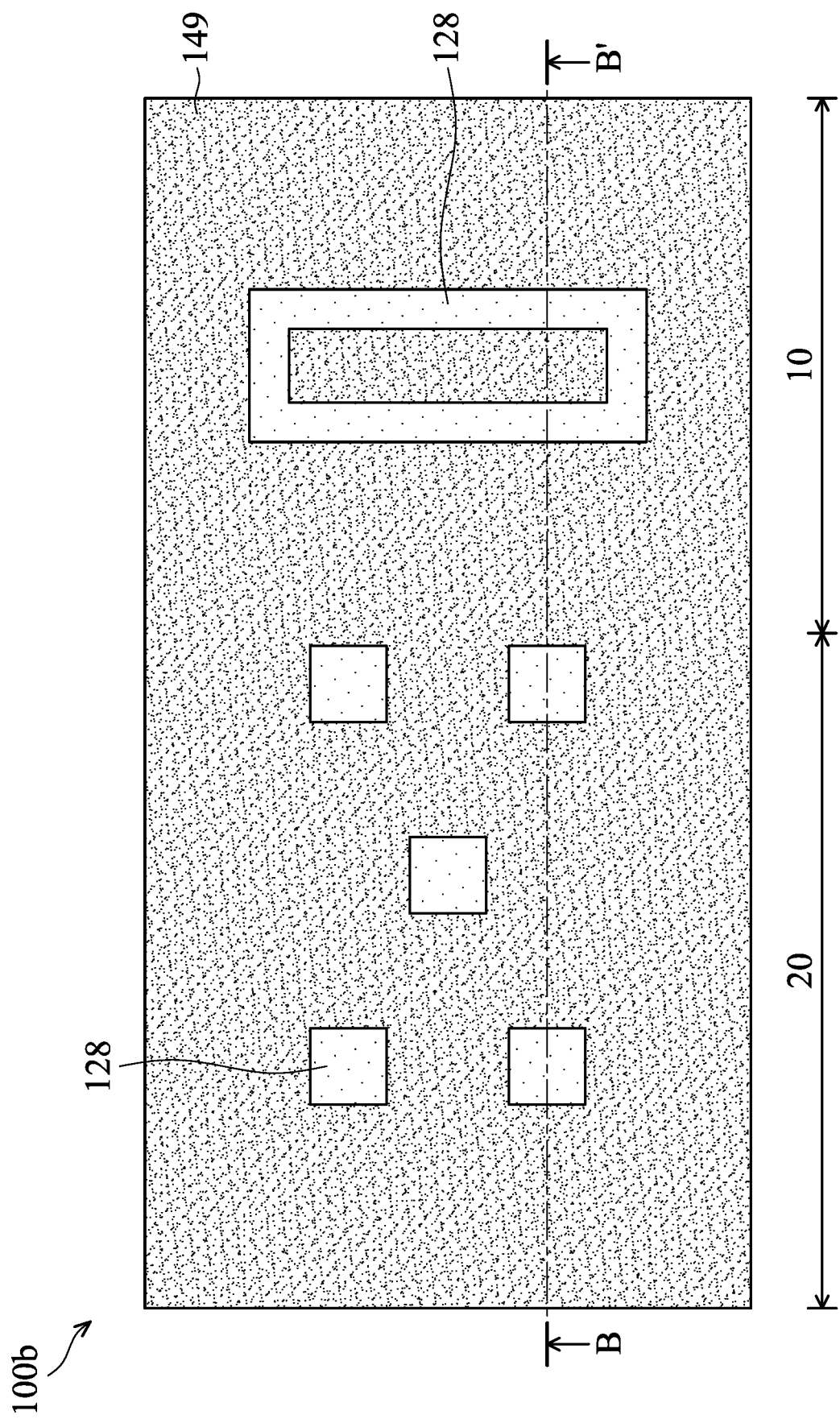
Figure 5B:
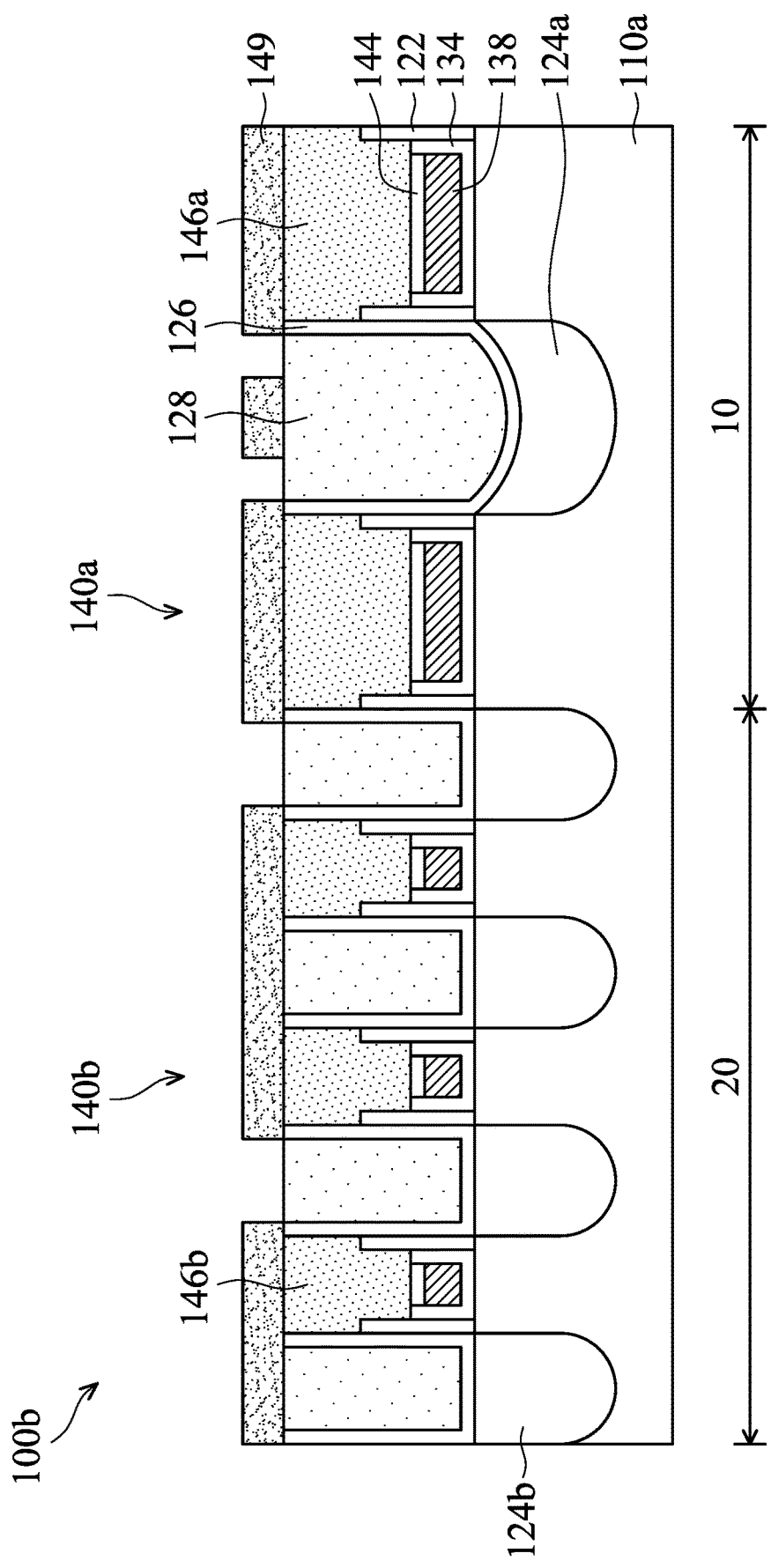

Next, as shown in FIGS. 4B and 5B, a photoresist material is formed on the first ILD layer 128 and the first hard mask layer 146a, the second hard mask layer 146b and then it is patterned to form a patterned photoresist layer 149, in accordance with some embodiments. The patterned photoresist layer 149 has a number of openings to expose a portion of the first ILD layer 128. It should be noted that, the CESL 126 is not exposed by the opening of the patterned photoresist layer 149. As shown in FIG. 4B, the exposed first ILD layer 128 in the first region 10 has an enclosed rectangular shape when seen from a top view. The exposed first ILD layer 128 in the second region 20 has a rectangular shape when seen from a top view.

Figure 4C:
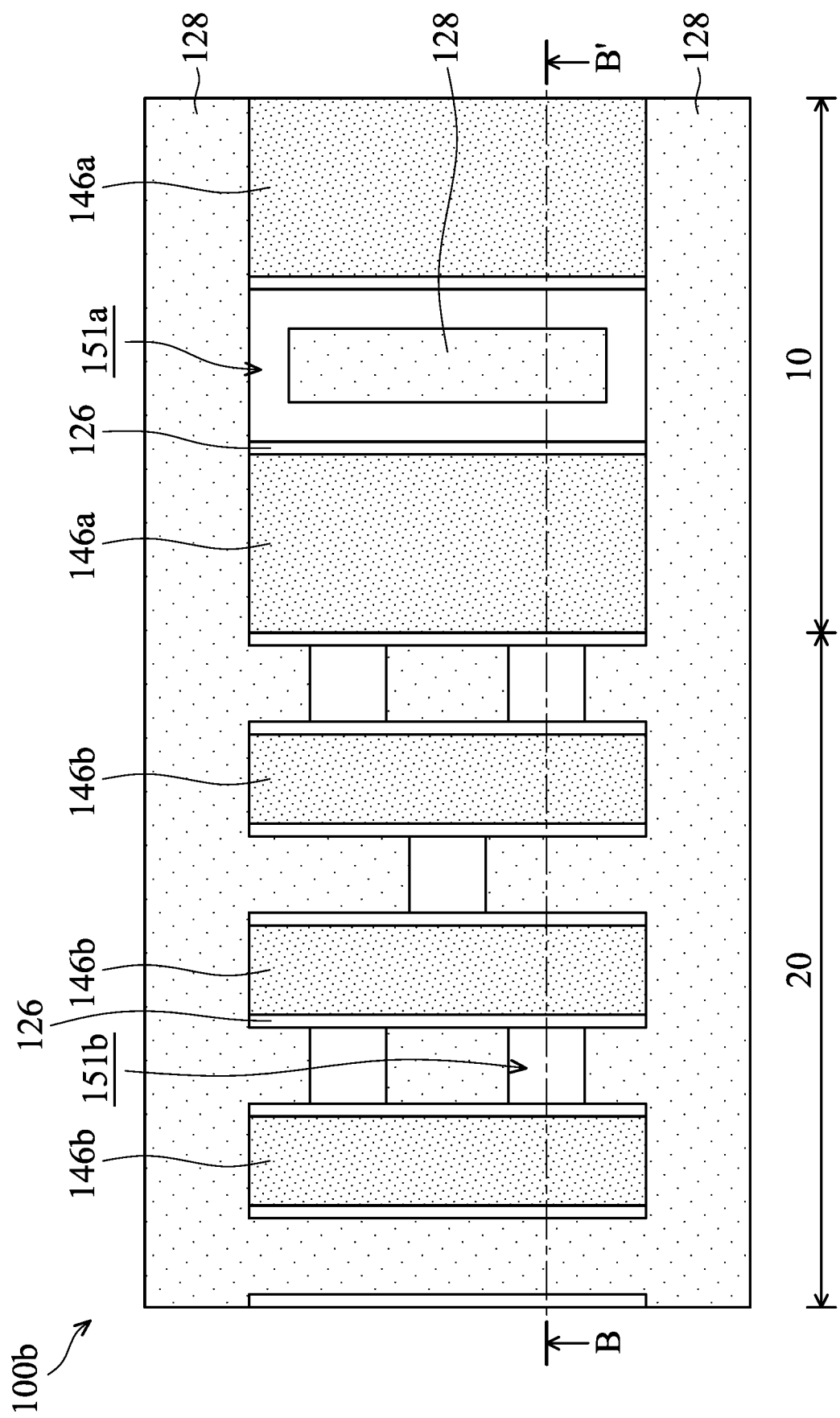
Figure 5C:
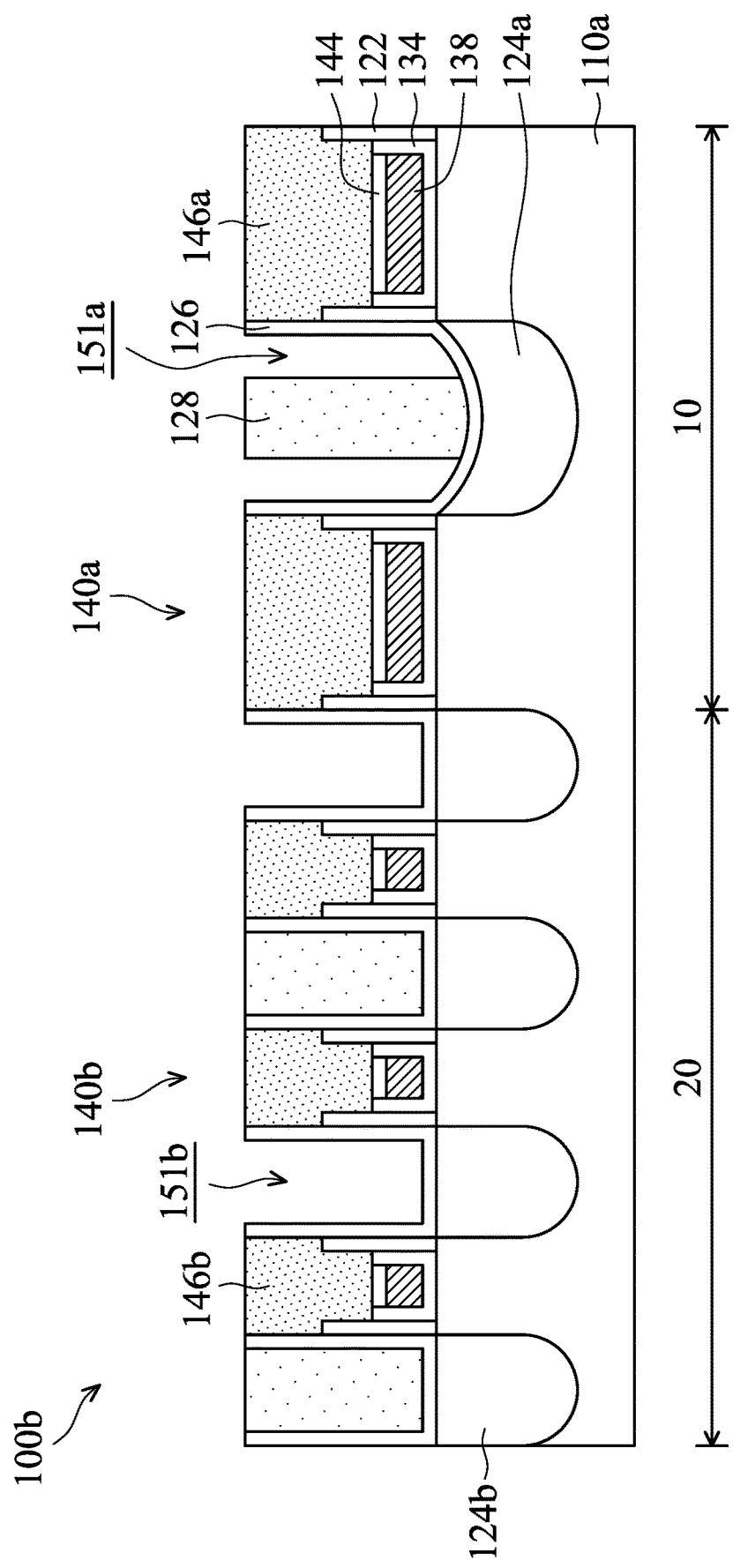

Afterwards, as shown in FIGS. 4C and 5C, the exposed first ILD layer 128 is removed by using the patterned photoresist layer 149 as the mask to form a first recess 151a in the first region 10 and a second recess 151b in the second region 20, in accordance with some embodiments of the disclosure. It should be noted that, the portion of the CESL 126 which is directly below the exposed first ILD layer 128 is not removed since the CESL 126 has a relatively higher etching selectivity in relating to the first ILD layer 128. Therefore, the CESL 126 is exposed by the first recess 151a and the second recess 151b.

As shown in FIG. 4C, in the first region 10, the first ILD layer 128 is surrounded by the first recess 151a, and the first recess 151a has an enclosed rectangular shape. In the second region 20, the first ILD layer 128 is divided into multiple portions by the second recess 151b. The shape of the first recess 151a and the second recess 151b is not limited to the rectangular shape, it can be other shape, such as circular shape or a polygonal shape.

In some embodiments, the exposed first ILD layer 128 is removed by an etching process, such as a dry etching process or a wet etching process. In some embodiments, the exposed first ILD layer 128 is removed by anisotropic etching process with an ash process. In some embodiments, the etching gas used in the anisotropic etching process includes CHxFy. In some embodiments, the ash process includes using nitrogen gas (N2) and hydrogen gas (H2). In addition, the anisotropic etching process may include using plasma etching, such as an Ar ion bombardment process.

Figure 4D:
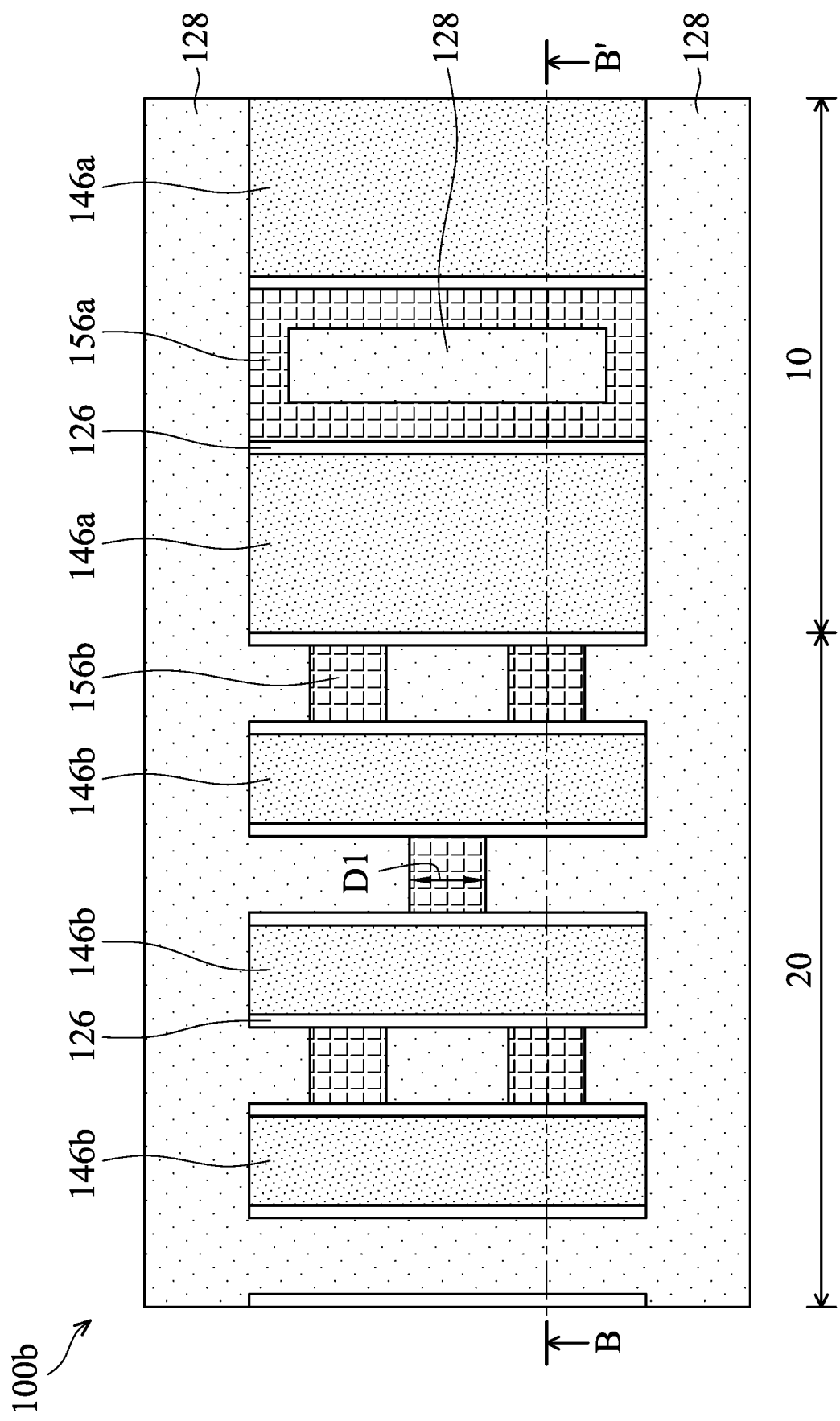
Figure 5D:
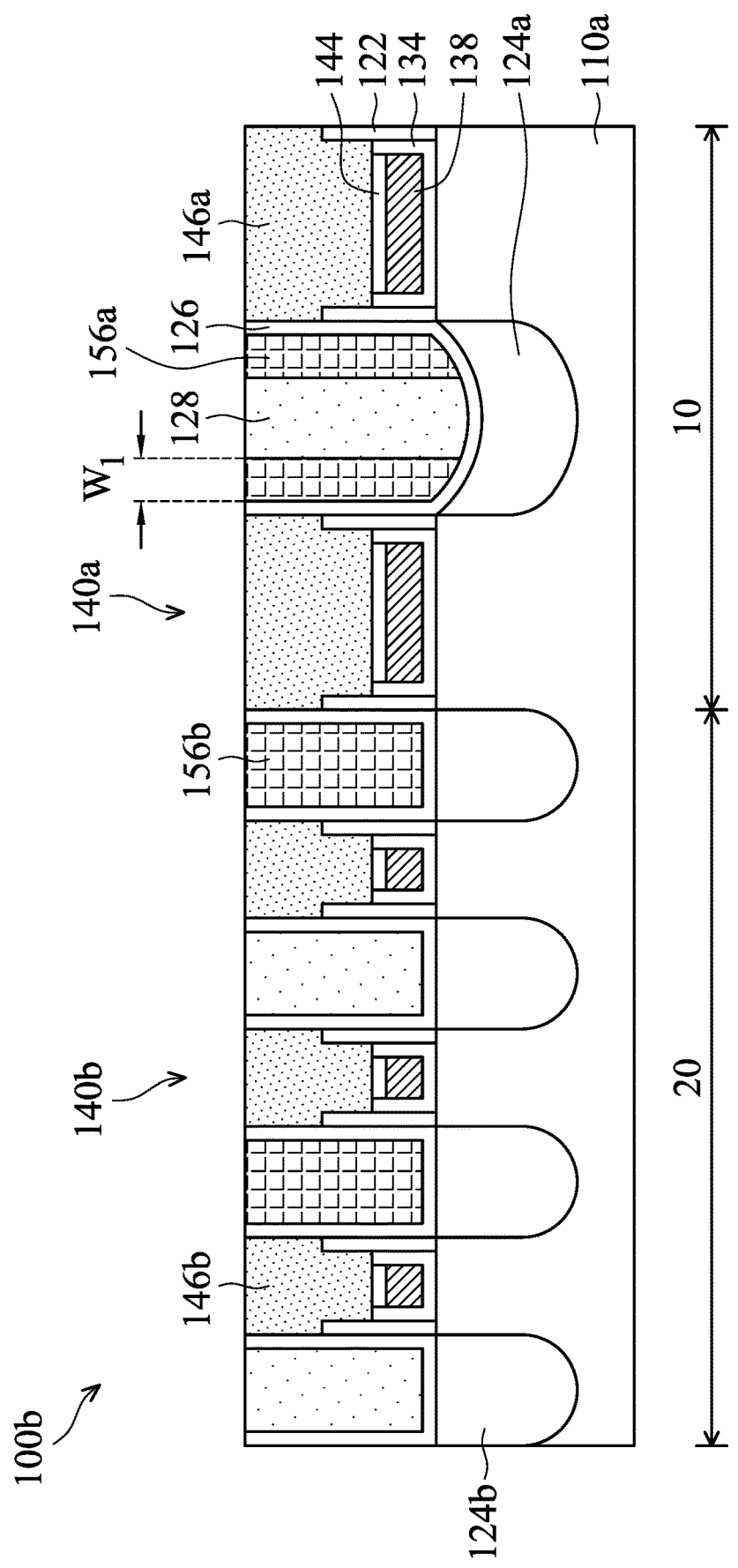

Next, as shown in FIGS. 4D and 5D, a first filling layer 156a is formed in the first recess 151a in the first region 10, and a second filling layer 156b is formed in the second recess 151b in the second region 20, in accordance with some embodiments of the disclosure. The filling material is formed in the first recess 151a and the second recess 151b, and a polishing process is performed to remove a portion of the filling material to form the first filling layer 156a and the second filling layer 156b. The top surface of the gate spacer layer 122 is lower than the top surface of the first filling layer 156a and the top surface of the second filling layer 156b.

As shown in FIG. 4D, in the first region 10, the remaining first ILD layer 128 is surrounded by the first filling layer 156a when seen from a top view, and the first filling layer 156a is surrounded by the CESL 126 and the first ILD layer 128 when seen from a top view. The first filling layer 156a has a ring-shaped structure, but the CESL 126 does not have a ring-shaped structure. The CESL 126 is formed on opposite sidewalls of the first filling layer 156a, not on four sidewalls of the first filling layer 156a when seen from a top view. In the second region 20, the first ILD layer 128 is divided into several portions, and the adjacent portions of the first ILD layer 128 is separated from each other by the second filling layer 156b. The second filling layer 156b in the second region 20 is used as a cut pattern.

The first filling layer 156a in the first region 10 and the second filling layer 156b in the second region 20 respectively are made of a material which is different from that of the first ILD layer 128. The first filling layer 156a and the second filling layer 156b both have a higher etching selectivity in relating to the first ILD layer 128. In some embodiments, the first filling layer 156a is made of dielectric layer, such as LaO, AlO, YO, TaCN, ZrSi, SiOCN, SiOC, SiCN, LaO, ZrN, ZrAlO, TiO, TaO, ZrO, HfO, SiN, HfSi, AlON, SiC, ZnO. In some embodiments, the second filling layer 156b is made of dielectric layer, such as LaO, AlO, YO, TaCN, ZrSi, SiOCN, SiOC, SiCN, LaO, ZrN, ZrAlO, TiO, TaO, ZrO, HfO, SiN, HfSi, AlON, SiC, ZnO. In some embodiments, the first filling layer 156a and the second filling layer 156b are made of the same material.

As shown in FIG. 4D, the second filling layer 156b along the direction of the second gate structure 140b has a first distance D1. The second filling layer 156b in the second region 20 is used as a cut pattern. In some embodiments, the first distance D1 is in a range from about 6 nm to about 50 nm. As shown in FIG. 5D, the first filling layer 156a has a first width W1 along the direction of the first fin structure 110a. In some embodiments, the first width W1 is in a range from about 2 nm to about 50 nm.

Figure 4E:
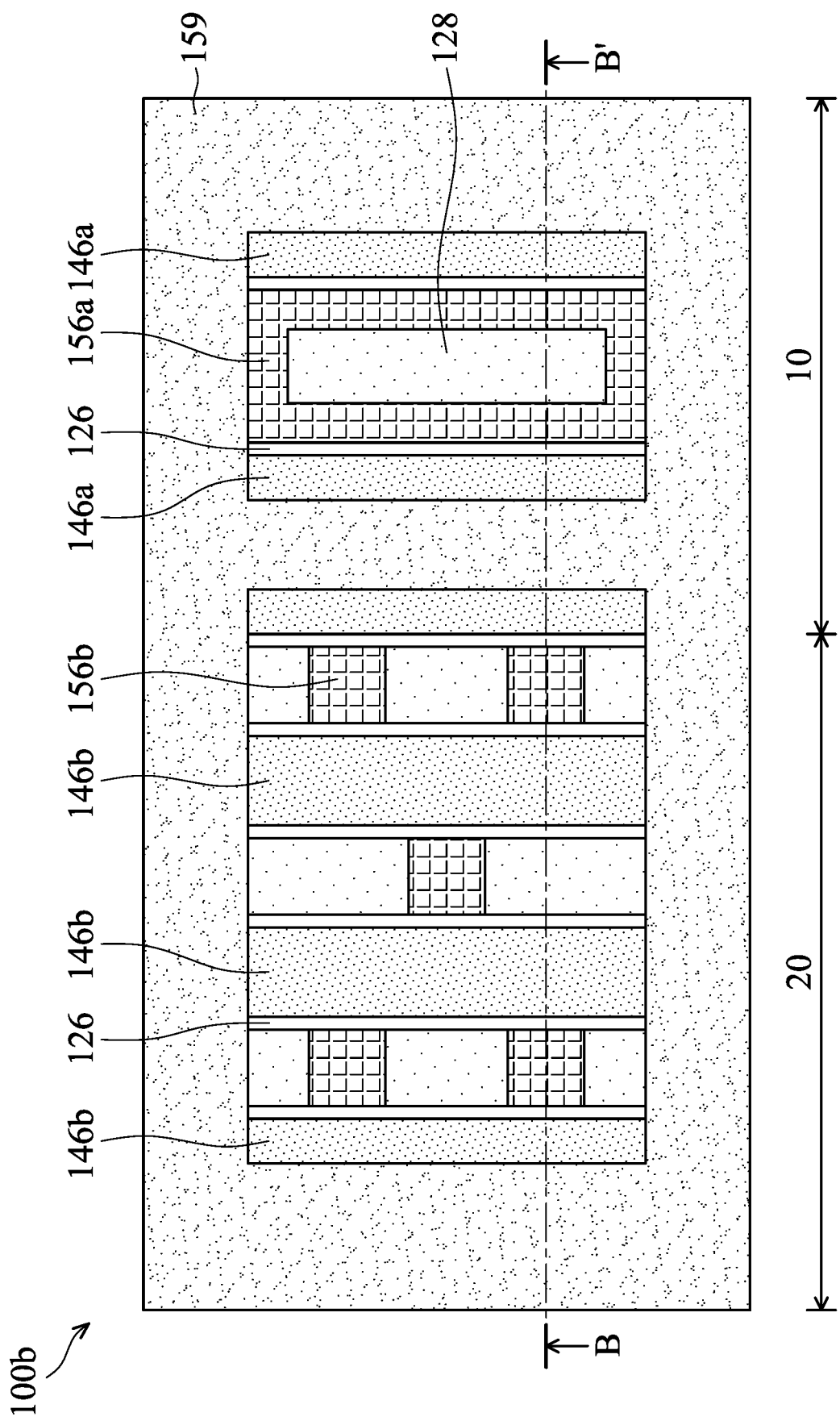
Figure 5E:
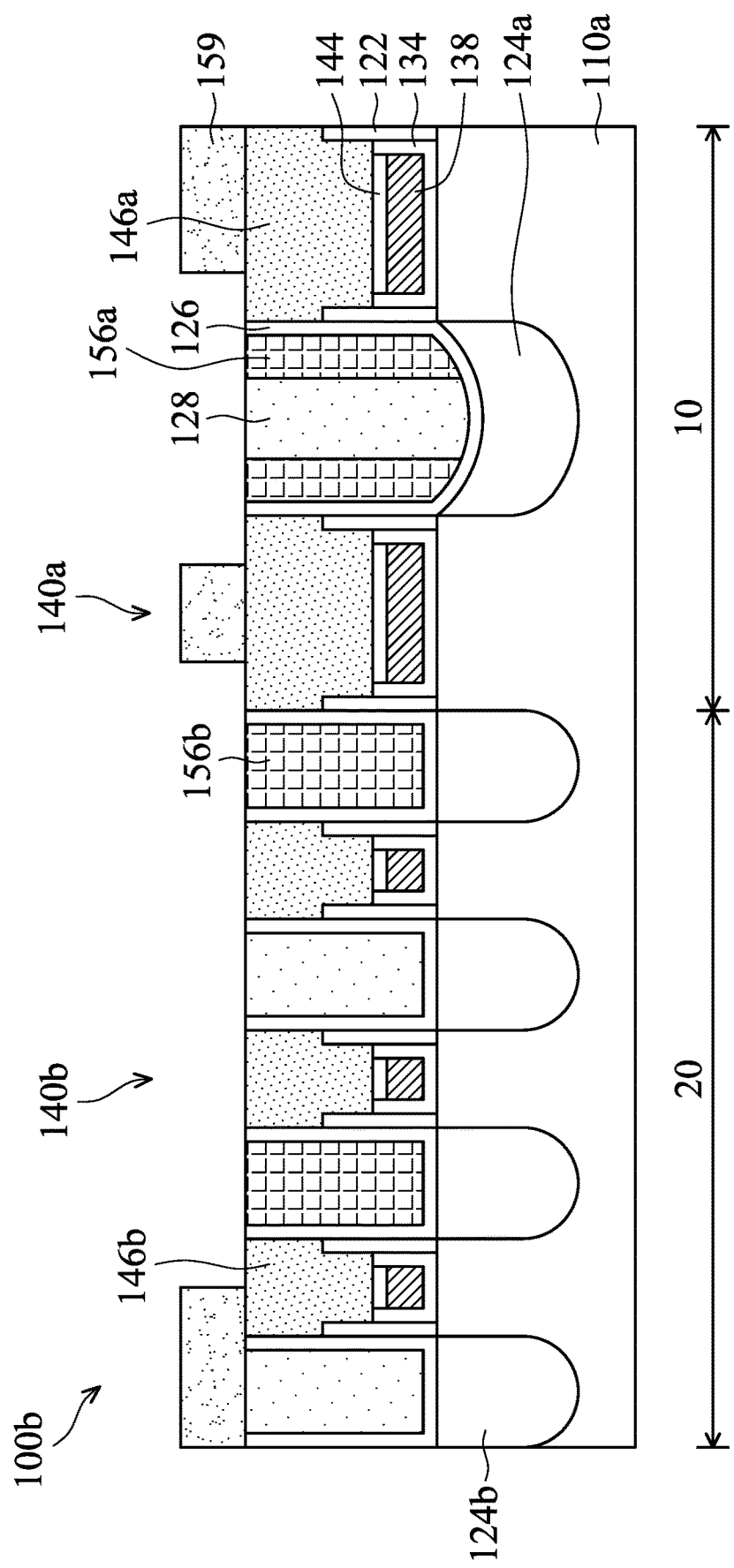

Afterwards, as shown in FIGS. 4E and 5E, a photoresist material is formed on the first ILD layer 128 and the hard mask layer 146a, 146b and then it is patterned to form a patterned photoresist layer 159, in accordance with some embodiments. The patterned photoresist layer 159 has a number of openings to expose a portion of the first ILD layer 128, a portion of the first filling layer 156a, a portion of the second filling layer 156b, a portion of the CESL 126. It should be note that, the opening of the patterned photoresist layer 159 in FIG. 5F is greater than the opening of the patterned photoresist layer 149 in FIG. 5B.

Figure 4F:
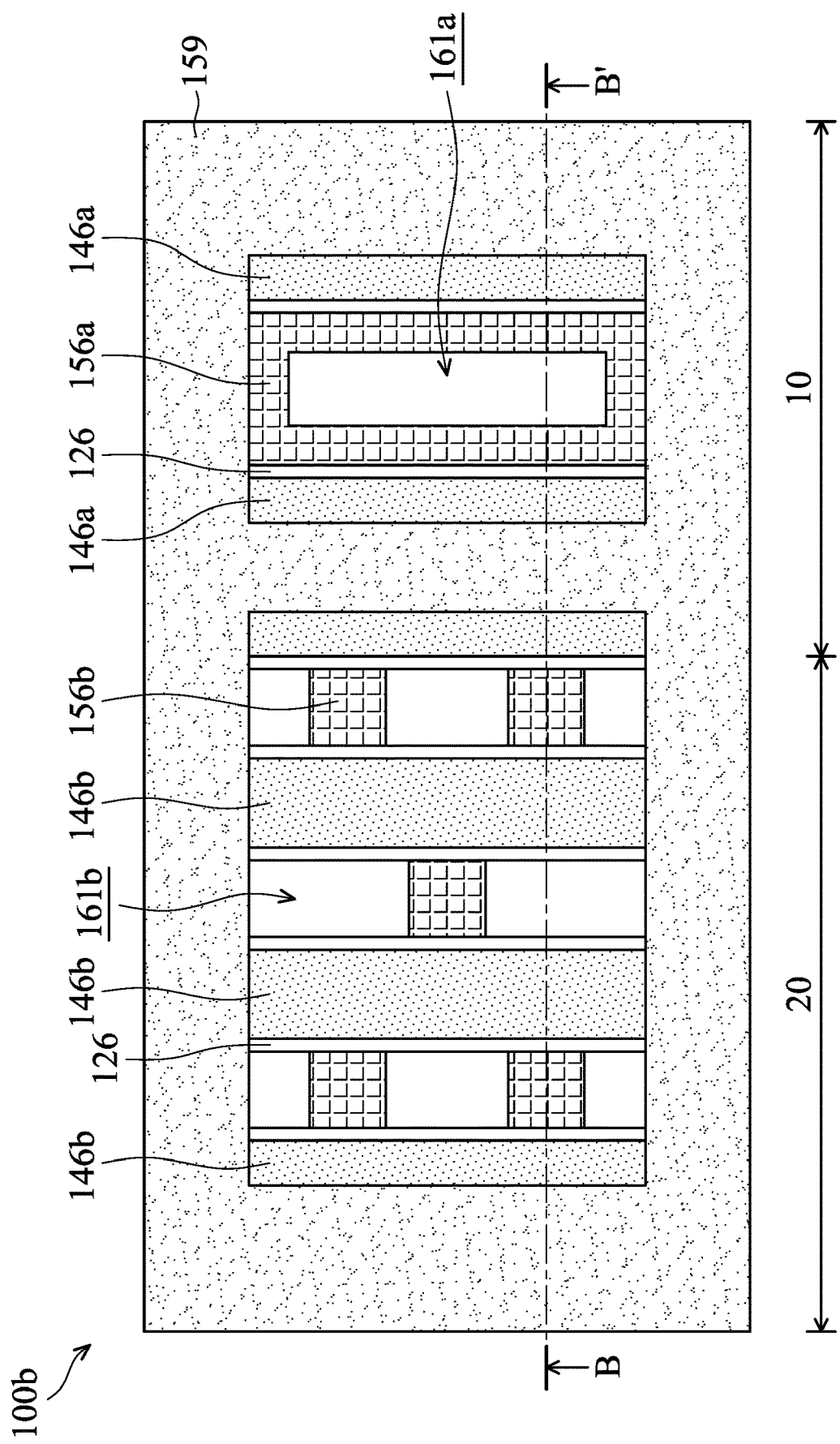
Figure 5F:
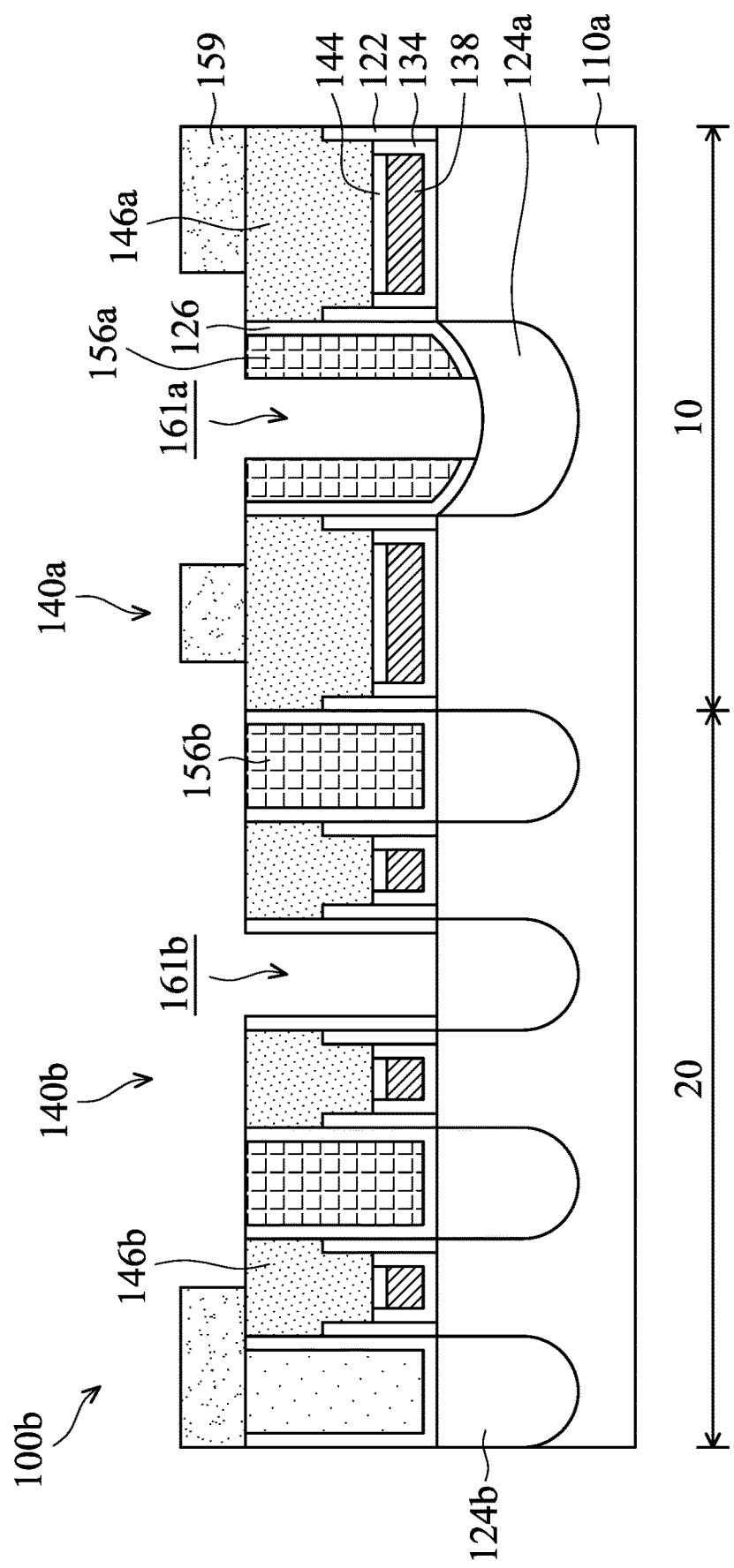

Next, as shown in FIGS. 4F and 5F, a portion of the first ILD layer 128 is removed to form a first trench 161a in the first region 10 and a second trench 161b in the second region 20, in accordance with some embodiments of the disclosure.

It should be noted that, the first ILD layer 128 is removed, but the first filling layer 156a and the second filling layer 156b are not removed since the first filling layer 156a and the second filling layer 156b have a higher etching selectivity in relating to the first ILD layer 128. In addition, the first ILD layer 128 is removed, but the first hard mask layer 146a and the second hard mask layer 146b are not removed since the first hard mask layer 146a and the second hard mask layer 146b have a higher etching selectivity in relating to the first ILD layer 128. Furthermore, the first ILD layer 128 is removed, but the CESL 126 is not removed since the CESL 126 has a higher etching selectivity in relating to the first ILD layer 128.

The portion of the first ILD layer 128 is removed by an isotropic etching process. The tool type of the isotropic etching process may be inductively-coupled plasma (ICP) or a capacitively coupled plasma (CCP) etching process. In some embodiments, the etchant used in the isotropic etching process includes NF$_3$, H$_2$, O$_2$, He, HBr, HCl, H$_2$O, CF$_4$, CH$_3$F or applicable materials. In some embodiments, isotropic etching process is performed in a pressure in a range from about 500 mtorr to about 10 torr. When the pressure of the isotropic etching process is performed within the above-mentioned range, the etching efficiency is high and low unwanted by-produce is remaining. In some embodiments, the isotropic etching process is performed in a temperature in a range from about 5 degrees Celsius to about 120 degrees Celsius. When the temperature of the isotropic etching process is performed within the above-mentioned range, the etching selectivity between the first ILD layer 128 and the first filling layer 156a is high enough.

In a comparative embodiment, the portion of the first ILD layer 128 is removed by an anisotropic etching process. It should be noted that, the first hard mask layer 146a and the second hard mask layer 146b may be removed along with the portion of the first ILD layer 128 since the first hard mask layer 146a and the second hard mask layer 146b do not have enough etching selectively in relating to the first ILD layer 128 when the anisotropic etching process is performed. Once the first hard mask layer 146a and the second hard mask layer 146b are removed along with the first ILD layer 128, the first gate structure 140a and the second gate structure 140b may be removed or damaged due to the loss of the first hard mask layer 146a and the second hard mask layer 146b. It should be noted that, in this embodiments, the portion of the first ILD layer 128 in FIGS. 4F and 5F, is not removed by the anisotropic etching process.

Figure 4G:
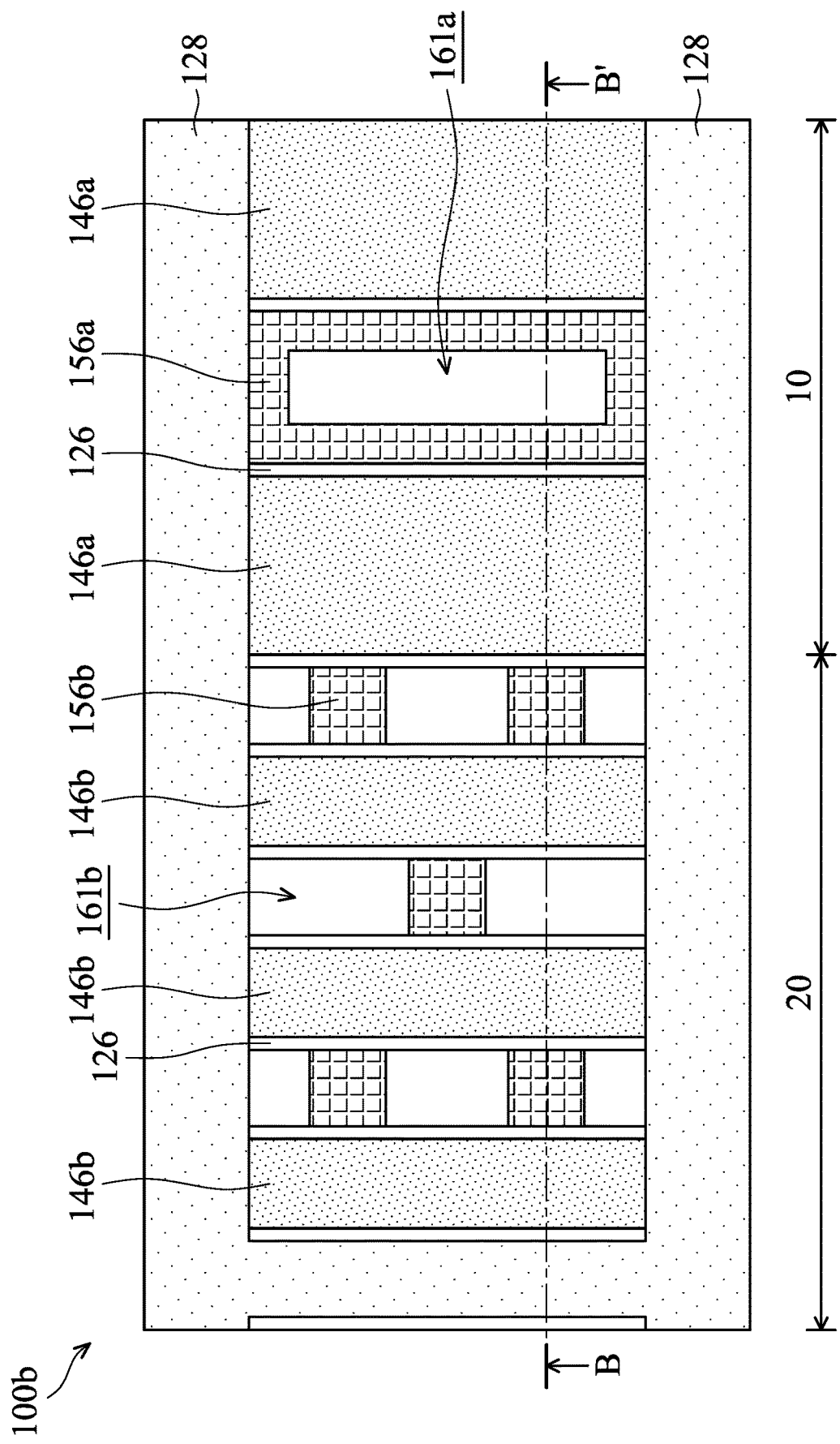
Figure 5G:
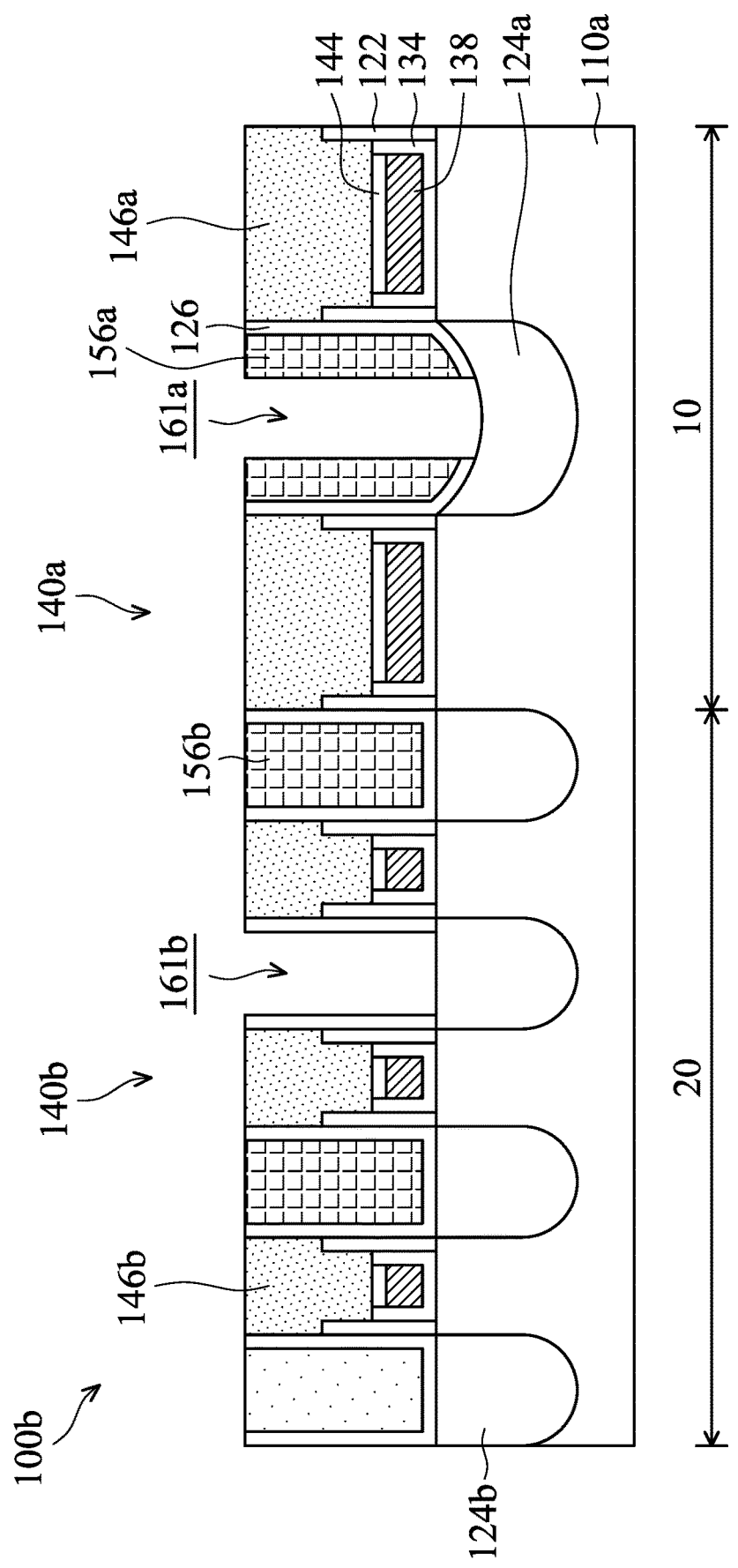

Afterwards, as shown in FIGS. 4G and 5G, the patterned photoresist layer 159 is removed, in accordance with some embodiments of the disclosure. In some embodiments, the patterned photoresist layer 159 is removed by an ash process, and the temperature of the ash process is operated in a range from about 25 degrees Celsius to about 125 degrees Celsius, and the gas used in the ash process includes N$_2$, H$_2$ or another applicable gas.

Figure 4H:
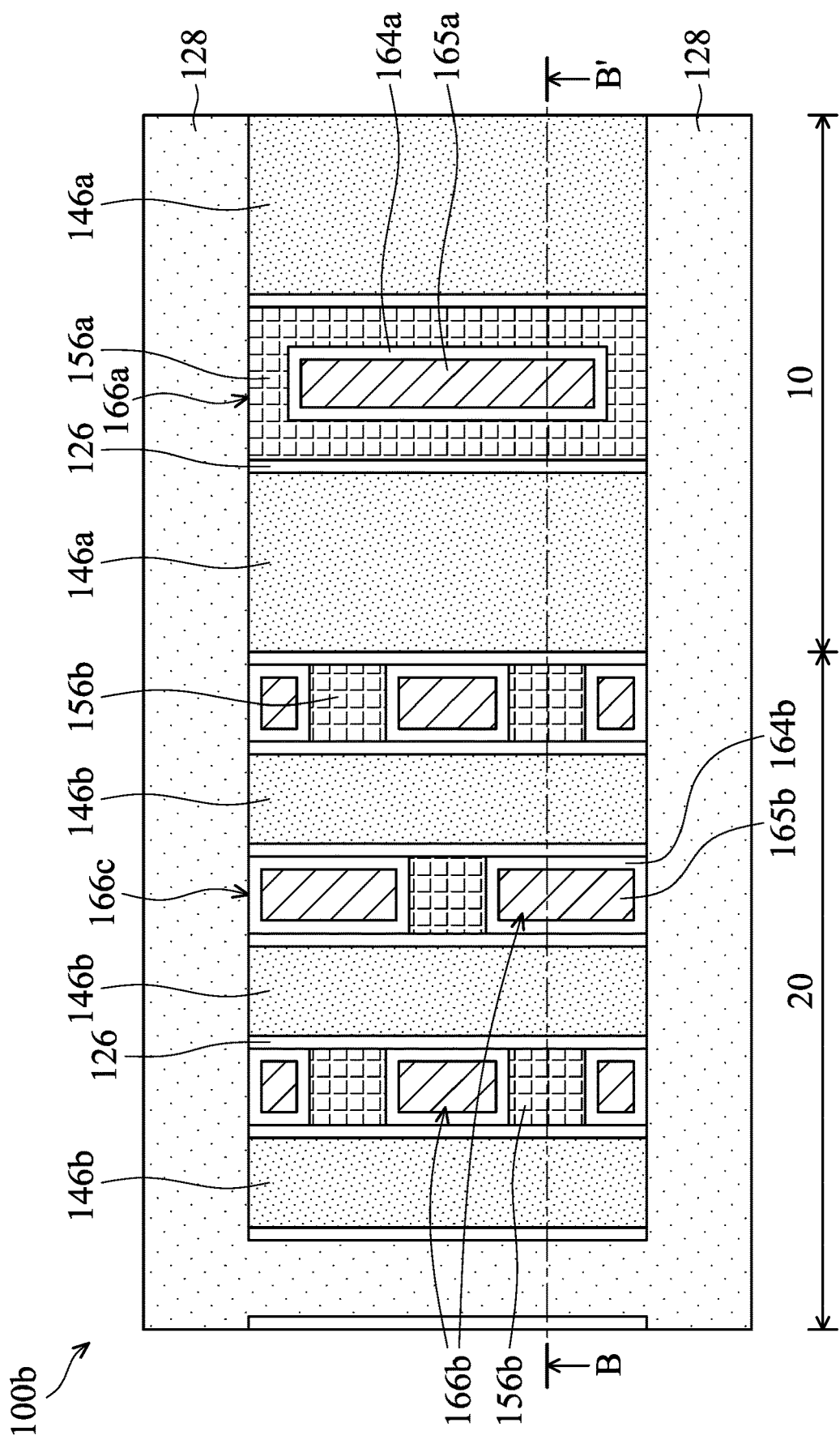
Figure 5H:
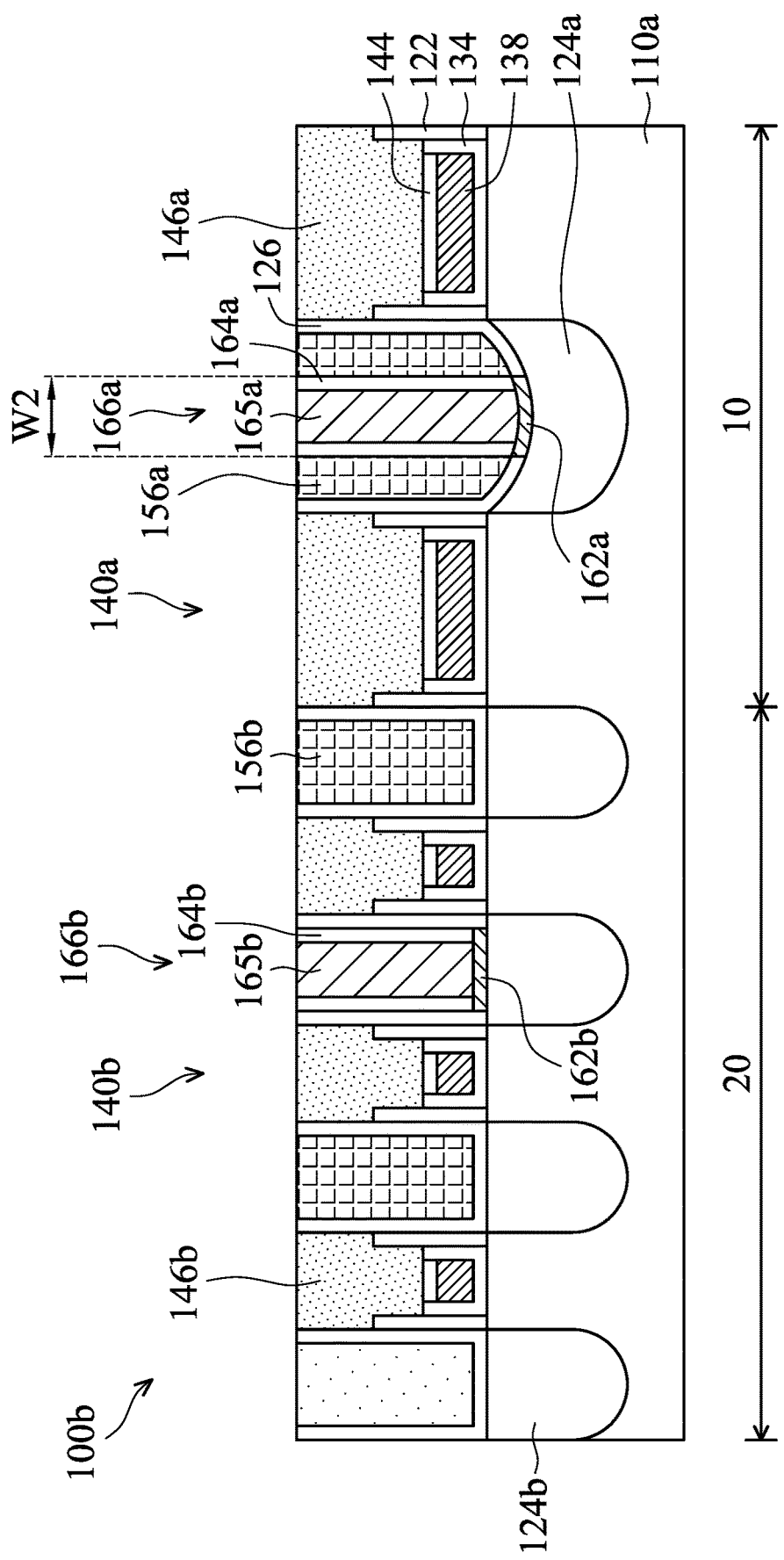

Next, as shown in FIGS. 4H and 5H, a first metal silicide layer 162a is formed on the first S/D structure 124a and a first S/D contact structure 166a is formed on the first metal silicide layer 162a, a second metal silicide layer 162b is formed on the second S/D structure 124b and a second S/D contact structure 166b is formed on the second metal silicide layer 162b, in accordance with some embodiments of the disclosure. The width of the first S/D contact structure 166a in the first region 10 is greater than the width of the second S/D contact structure 166b in the second region 20. The first S/D contact structure 166a is completely surrounded by the first filling layer 156a in the first region 10 when seen from a top view.

The first metal silicide layer 162a and the second metal silicide layer 162b both are used to reduce contact resistance (Rcsd) between the first S/D contact structure 166a and the first S/D structure 124a, and between the second S/D contact structure 166b and the second S/D structure 124b. In some other embodiments, the first metal silicide layer 162a and the second metal silicide layer 162b respectively include nickel silicide (NiSix), titanium silicide (TiSix), cobalt silicide (CoSi), tungsten silicide (WSi), tantalum silicide (TaSix) or another applicable material.

The first S/D contact structure 166a includes a first glue layer 164a and a first conductive layer 165a formed on the first glue layer 164a. The second S/D contact structure 166b includes a second glue layer 164b and a second conductive layer 165b formed on the second glue layer 164b. In some embodiments, a portion of the first S/D contact structure 166a is lower than the top surface of second S/D structure 124b.

In some embodiments, the first glue layer 164a and the second glue layer 164b respectively have a U-shaped structure. In some embodiments, the first glue layer 164a includes one layer or multiple layers. In some embodiments, the first glue layer 164a and the second glue layer 164b respectively include tantalum (Ta), tantalum nitride (TaN), titanium (Ti), titanium nitride (TiN), cobalt tungsten (CoW) or another applicable material. In some embodiments, the first glue layer 164a is formed using a deposition process, such as a chemical vapor deposition (CVD) process, physical vapor deposition (PVD) process, atomic layer deposition (ALD) process, plating process or another applicable process. The process for forming the second glue layer 164b is the same or similar.

In some embodiments, the first conductive layer 165a and the second conductive layer 165b respectively include tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), TiN, TiSi, CoSi, NiSi, TaN, or another applicable material. In some embodiments, the first conductive layer 165a is formed using a deposition process, such as a chemical vapor deposition (CVD) process, physical vapor deposition (PVD) process, atomic layer deposition (ALD) process, plating process or another applicable process.

As shown in FIGS. 4H and 5H, the first filling layer 156a is surrounded by the CESL 126 and the gate spacer layer 122. The first filling layer 156a is between the first hard mask layer 146a and the first S/D contact structure 166a. The first filling layer 156a is in direct contact with the CESL 126, and the second filling layer 156b is in direct contact with the CESL 126.

As shown in FIG. 4H, there is a first interface between the first filling layer 156a and the first ILD layer 128 in the first region 10, and the first interface is parallel to the direction of the fin structure 110a when seen from a top view. There is a second interface between the first S/D contact structure 166a and the first filling layer 156a, and the first interface is parallel to the second interface when seen from a top view. There is a third interface between the first hard mask layer 146a and the first ILD layer 128 in the first region 10, the third interface is parallel to the direction of the fin structure 110a when seen from a top view, and the first interface is aligned with to the third interface.

In the second region 20, there are a number of second S/D contact structures 166b separated by the second filling layer 156b. In some embodiments, a second S/D contact structure 166b and a third S/D contact structure 166c (shown in FIG. 4H) are formed on opposite sidewalls of the second filling layer 156b, and the second S/D contact structure 166b is separated from the third S/D contact structure 166c by the second filling layer 156b.

Since the top surface of the first S/D structure 124a is lower than the bottom surface of the first gate structure 140a, a portion of the first filling layer 156a is lower than the bottom surface of the first gate structure 140a. The bottom surface of the first filling layer 156a is lower than the bottom surface of the second filling layer 156b, and the bottom surface of the first S/D contact structure 166a is lower than the bottom surface of the second S/D contact structure 166b.

The first S/D contact structure 166a has a second width $W_2$ along the direction of the first fin structure 110a. In some embodiments, the second width $W_2$ is in a range from about 0 nm to about 50 nm.

It should be noted that, a portion of the first ILD 128 is replaced by the first filling layer 156a, and a second portion of the first ILD layer 128 is replaced by the first S/D contact structure 166a. The first filling layer 156a and the first ILD layer 128 are made of different material, and the first filling layer 156a has a higher etching selectivity in relating to the first ILD layer 128, and therefore the first filling layer 156a is remaining while the first ILD layer 128 is removed to form the first trench 161a. The second portion of the first ILD layer 128 is removed by the isotropic etching process, rather than the anisotropic etching process. In the isotropic etching process, since the first filling layer 156a has a higher etching selectivity in relating to the first ILD layer 128, the first filling layer 156a is not removed. In addition, since the first hard mask layer 146 also has a higher etching selectivity in relating to the first ILD layer 128 in the isotropic etching process, the first hard mask layer 146a is left on the first gate structure 140a to protect the first gate structure 140a. Therefore, the loss of the first hard mask layer 146a is prevented, and the risk of damage of the first gate structure 140a is reduced.

Figure 6:
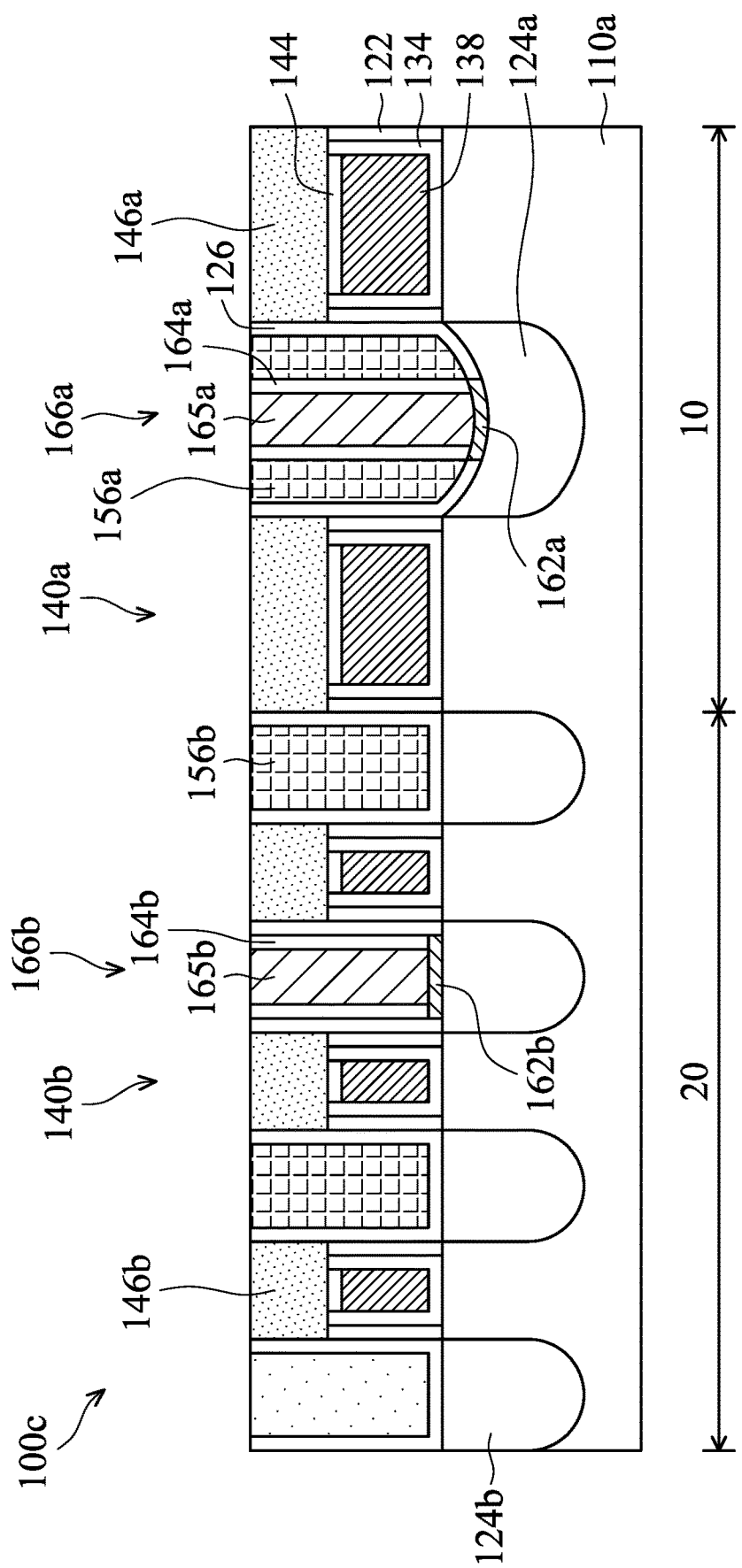
FIG. 6 shows a cross-sectional representation of a modified FinFET device structure, in accordance with some embodiments of the disclosure.

FIG. 6 shows a cross-sectional representation of a modified FinFET device structure 100c, in accordance with some embodiments of the disclosure. The FinFET device structure 100c of FIG. 6 is similar to, or the same as, the FinFET device structure 100b of FIG. 5H, the difference between FIG. 6 and FIG. 5H is that the first hard mask layer 146a and the second hard mask layer 146b both have rectangular shape. Materials and methods used to form the semiconductor structure 100c is similar to, or the same as, those used to form the semiconductor structure 100b and are not repeated herein. As shown in FIG. 6, the top surface of the gate spacer layer 122 is in direct contact with the bottom surface of the first hard mask layer 146a and the bottom surface of the second hard mask layer 146b.

Figure 7:
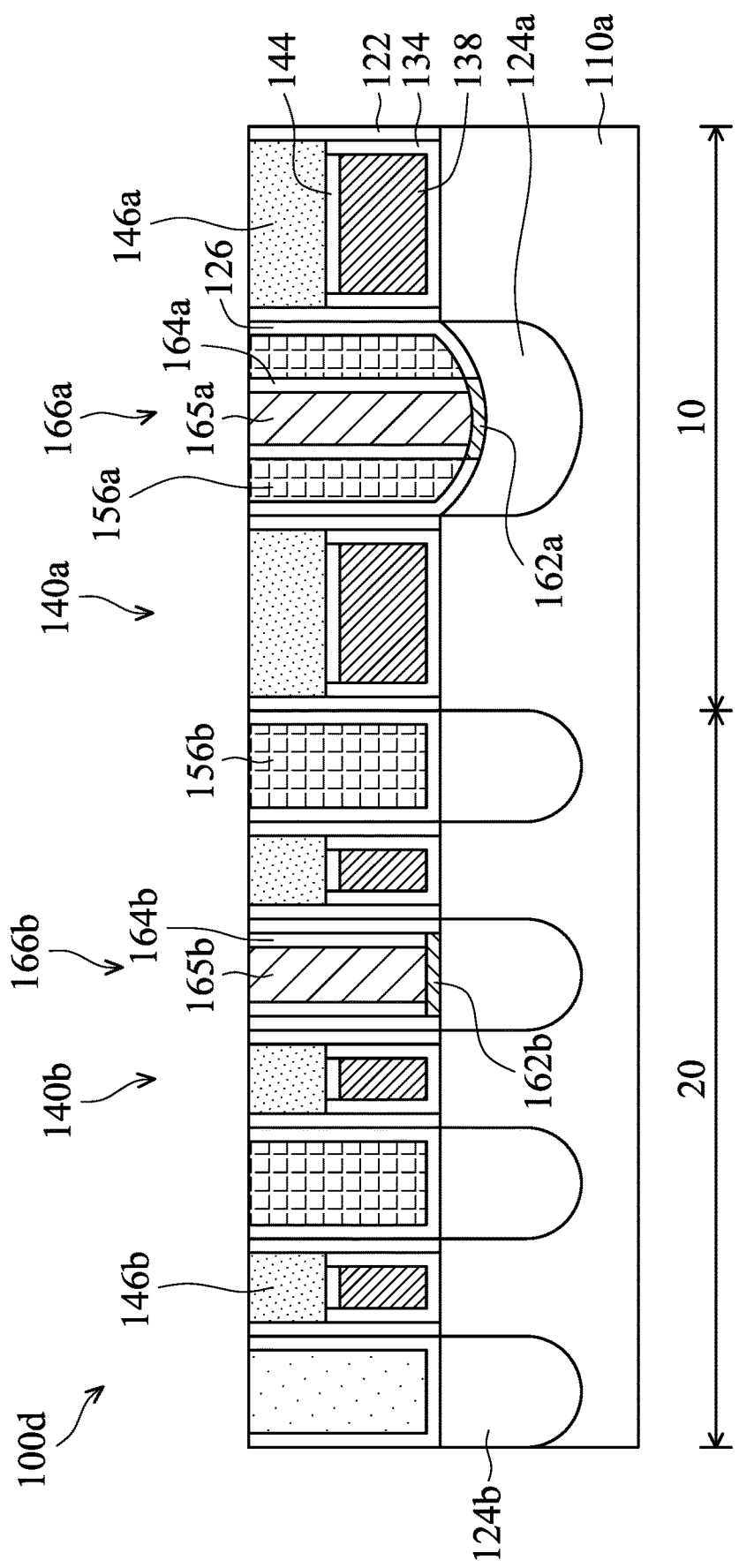
FIG. 7 shows a cross-sectional representation of a modified FinFET device structure, in accordance with some embodiments of the disclosure.

FIG. 7 shows a cross-sectional representation of a modified FinFET device structure 100d, in accordance with some embodiments of the disclosure. The FinFET device structure 100d of FIG. 7 is similar to, or the same as, the FinFET device structure 100b of FIG. 5H, the difference between FIG. 7 and FIG. 5H is that the first hard mask layer 146a and the second hard mask layer 146b both have rectangular shape. Materials and methods used to form the semiconductor structure 100d is similar to, or the same as, those used to form the semiconductor structure 100b and are not repeated herein. As shown in FIG. 7, the top surface of the gate spacer layer 122 is higher than the bottom surface of the first hard mask layer 146a and the second hard mask layer 146b. The top surface of the first hard mask layer 146a, the top surface of the second hard mask layer 146b and the top surface of the gate spacer layer 122 have substantially level.

Figure 8A:
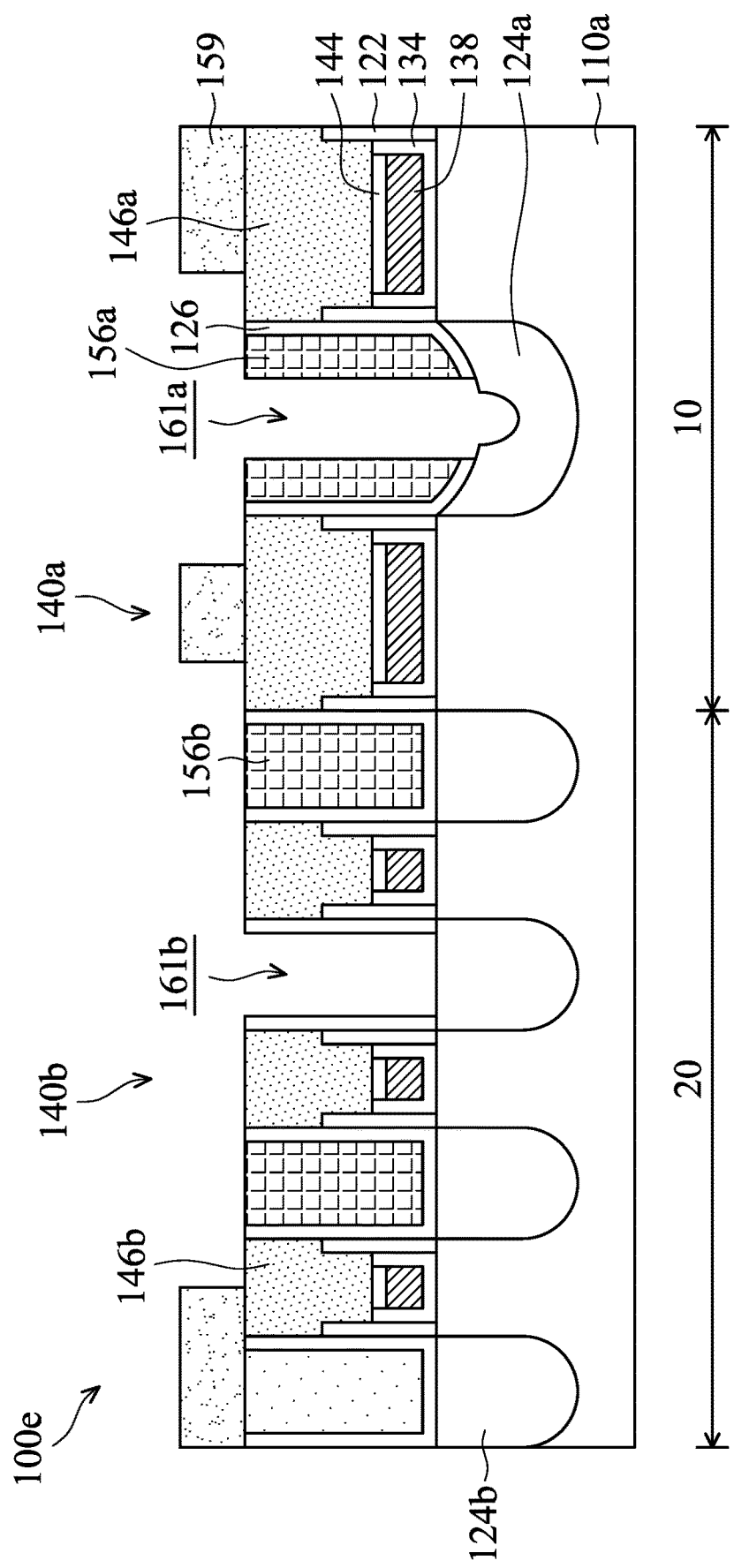
FIGS. 8A-8B show cross-sectional representations of a modified FinFET device structure, in accordance with some embodiments of the disclosure.
Figure 8B:
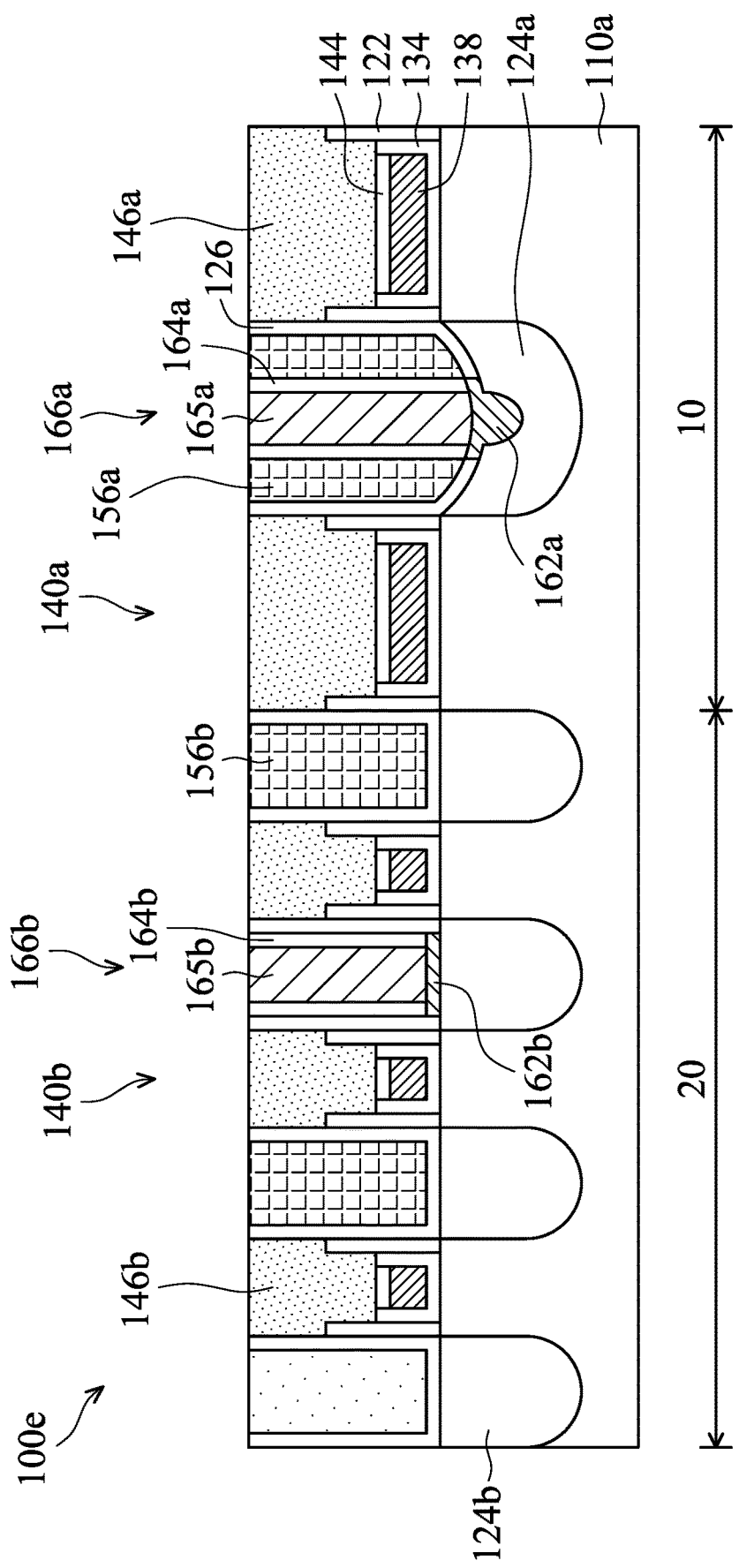

FIGS. 8A-8B show cross-sectional representations of a modified FinFET device structure 100e, in accordance with some embodiments of the disclosure. The FinFET device structure 100e of FIG. 8A is similar to, or the same as, the FinFET device structure 100b of FIG. 5H, the difference between FIG. 8A and FIG. 5H is that a portion of the first S/D structure 124a is removed. The bottom surface of the first trench 161a is lower than the bottom surface of the second trench 161b. Materials and methods used to form the semiconductor structure 100e is similar to, or the same as, those used to form the semiconductor structure 100b and are not repeated herein.

Afterwards, as shown in FIG. 8B, the first metal silicide layer 162a is formed on the first S/D structure 124a, and the first S/D contact structure 166a is formed on the first metal silicide layer 162a. The second metal silicide layer 162b is formed on the second S/D structure 124b, and the second S/D contact structure 166b is formed on the second metal silicide layer 162b.

Figure 9:
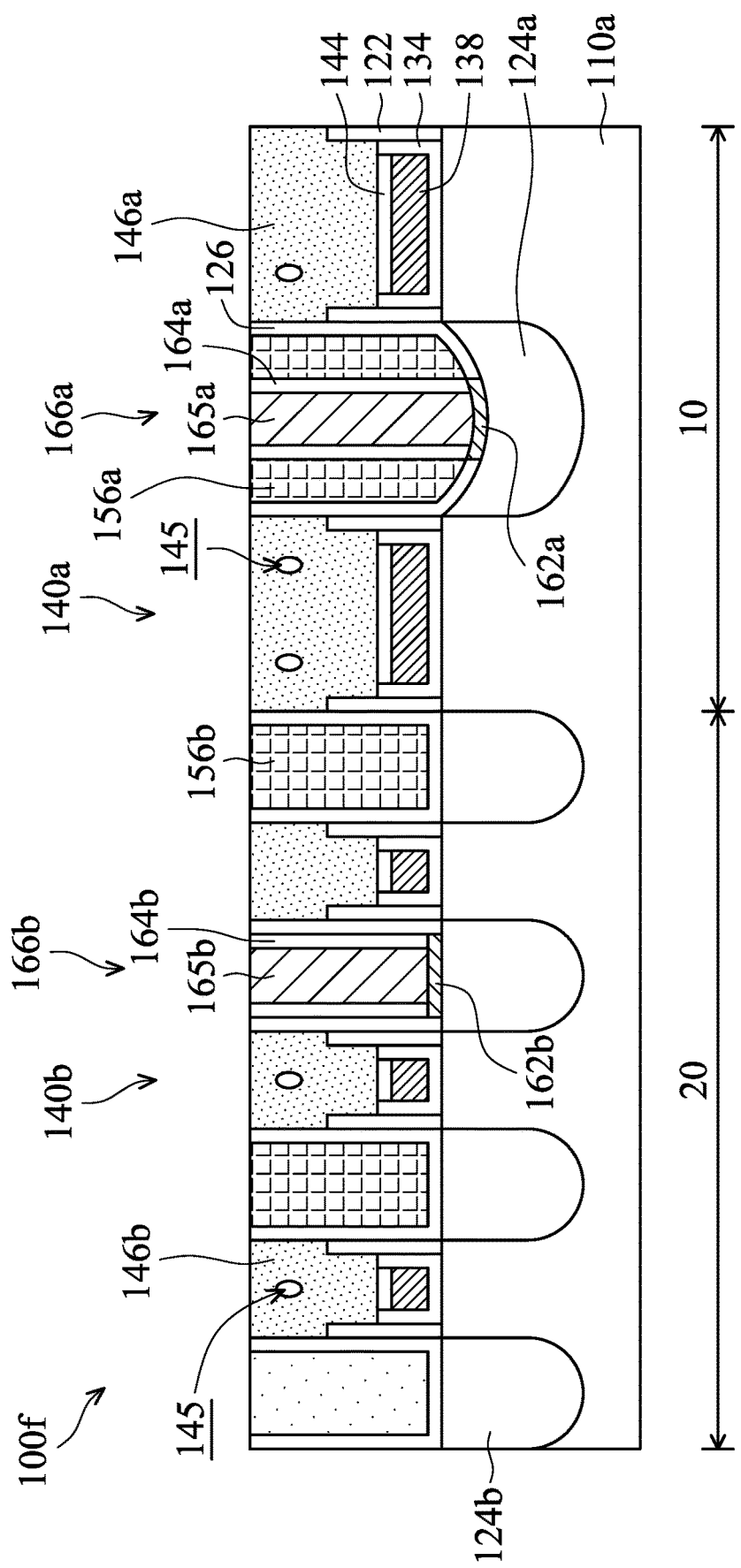
FIG. 9 shows a cross-sectional representation of a modified FinFET device structure, in accordance with some embodiments of the disclosure.

FIG. 9 shows a cross-sectional representation of a modified FinFET device structure 100f, in accordance with some embodiments of the disclosure. The FinFET device structure 100f of FIG. 9 is similar to, or the same as, the FinFET device structure 100b of FIG. 5H, the difference between FIG. 9 and FIG. 5H is that there are some voids 145 formed in the first hard mask layer 146a and the second hard mask layer 146b. Materials and methods used to form the semiconductor structure 100f is similar to, or the same as, those used to form the semiconductor structure 100b and are not repeated herein.

Figure 10:
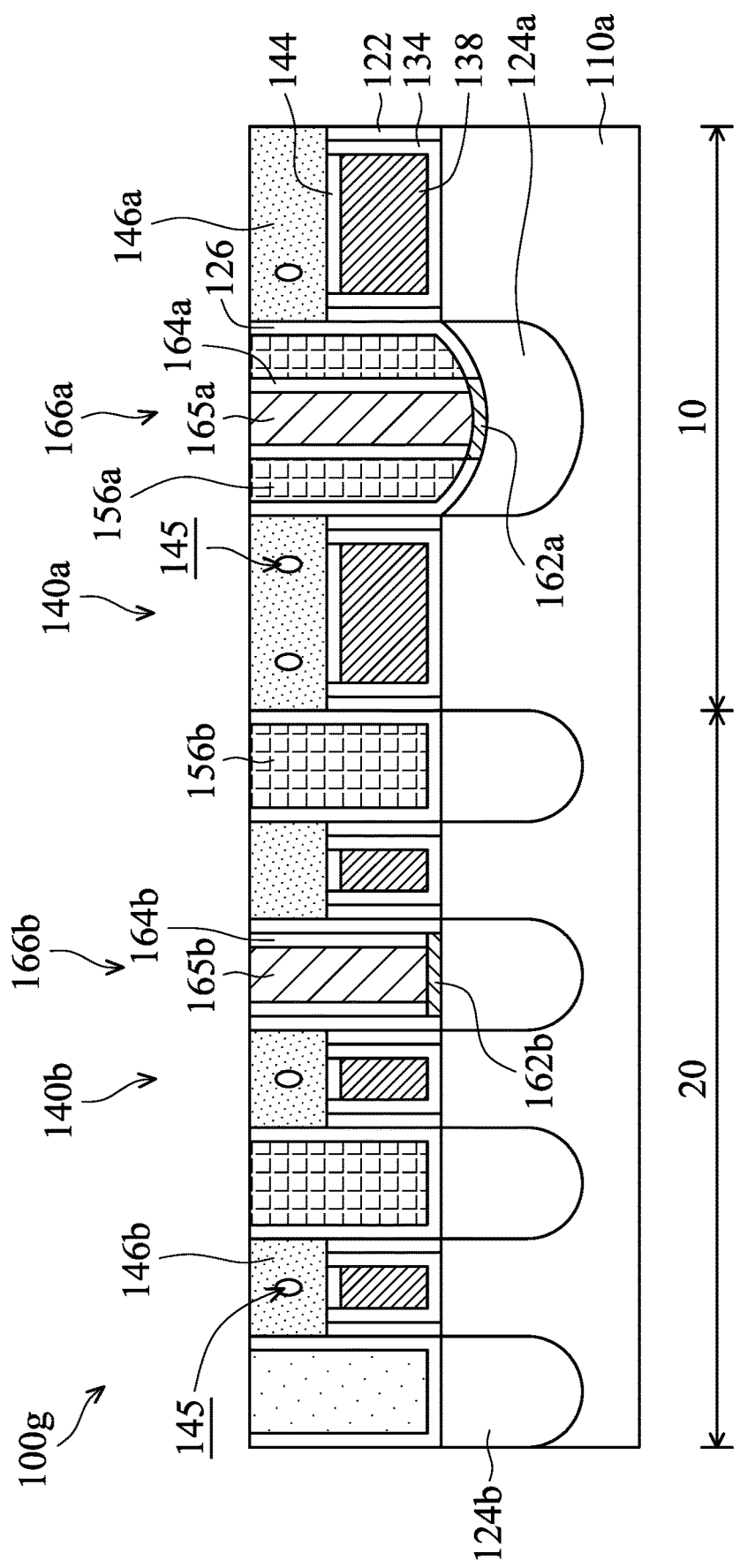
FIG. 10 shows a cross-sectional representation of a modified FinFET device structure, in accordance with some embodiments of the disclosure.

FIG. 10 shows a cross-sectional representation of a modified FinFET device structure 100g, in accordance with some embodiments of the disclosure. The FinFET device structure 100g of FIG. 10 is similar to, or the same as, the FinFET device structure 100f of FIG. 9, the difference between FIG. 10 and FIG. 9 is that the first hard mask layer 146a and the second hard mask layer 146b both have rectangular shape. Materials and methods used to form the semiconductor structure 100g is similar to, or the same as, those used to form the semiconductor structure 100f and are not repeated herein.

Figure 11:
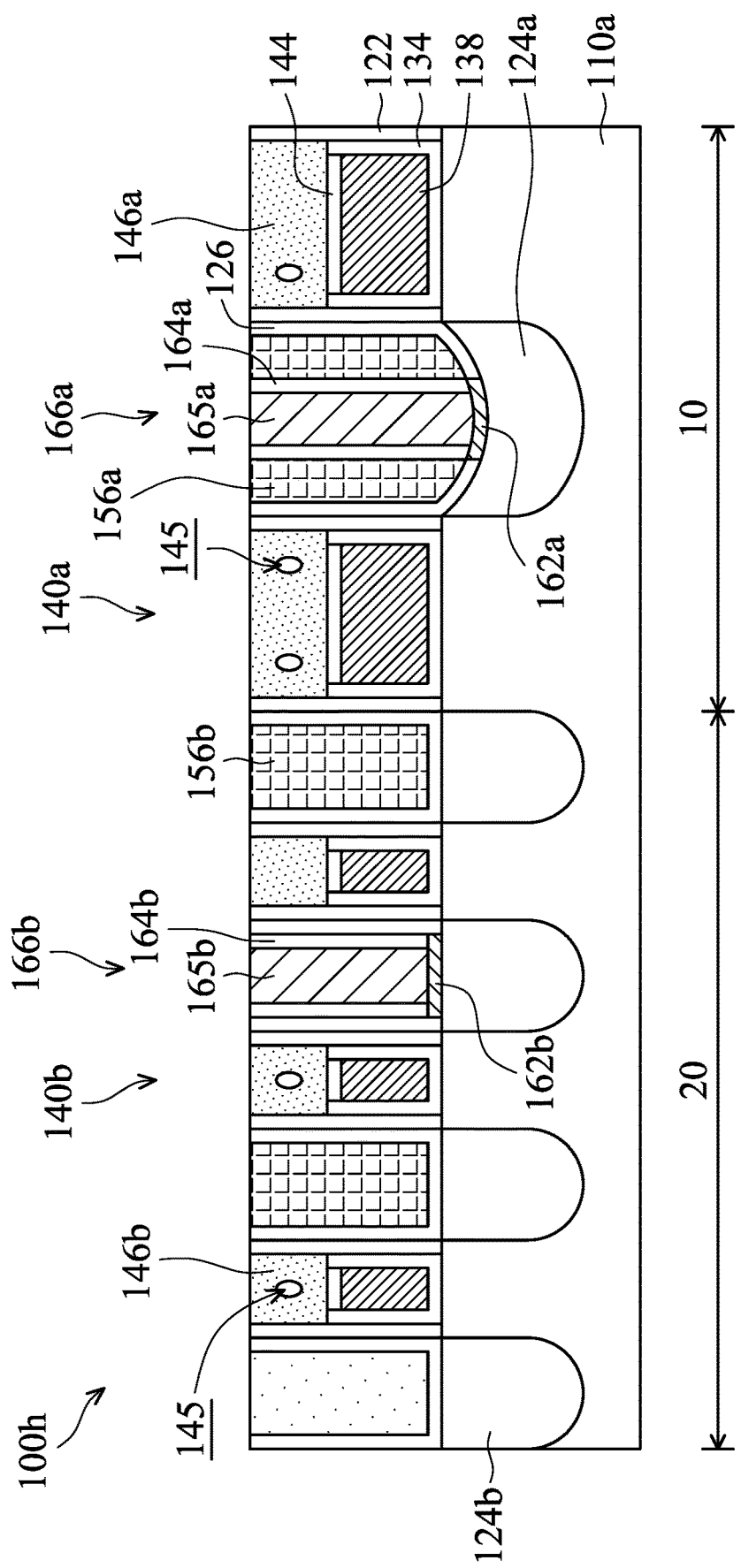
FIG. 11 shows a cross-sectional representation of a modified FinFET device structure, in accordance with some embodiments of the disclosure.

FIG. 11 shows a cross-sectional representation of a modified FinFET device structure 100h, in accordance with some embodiments of the disclosure. The FinFET device structure 100h of FIG. 11 is similar to, or the same as, the FinFET device structure 100f of FIG. 9, the difference between FIG. 11 and FIG. 9 is that the first hard mask layer 146a and the second hard mask layer 146b both have rectangular shape. Materials and methods used to form the semiconductor structure 100h is similar to, or the same as, those used to form the semiconductor structure 100f and are not repeated herein.

Figure 12:
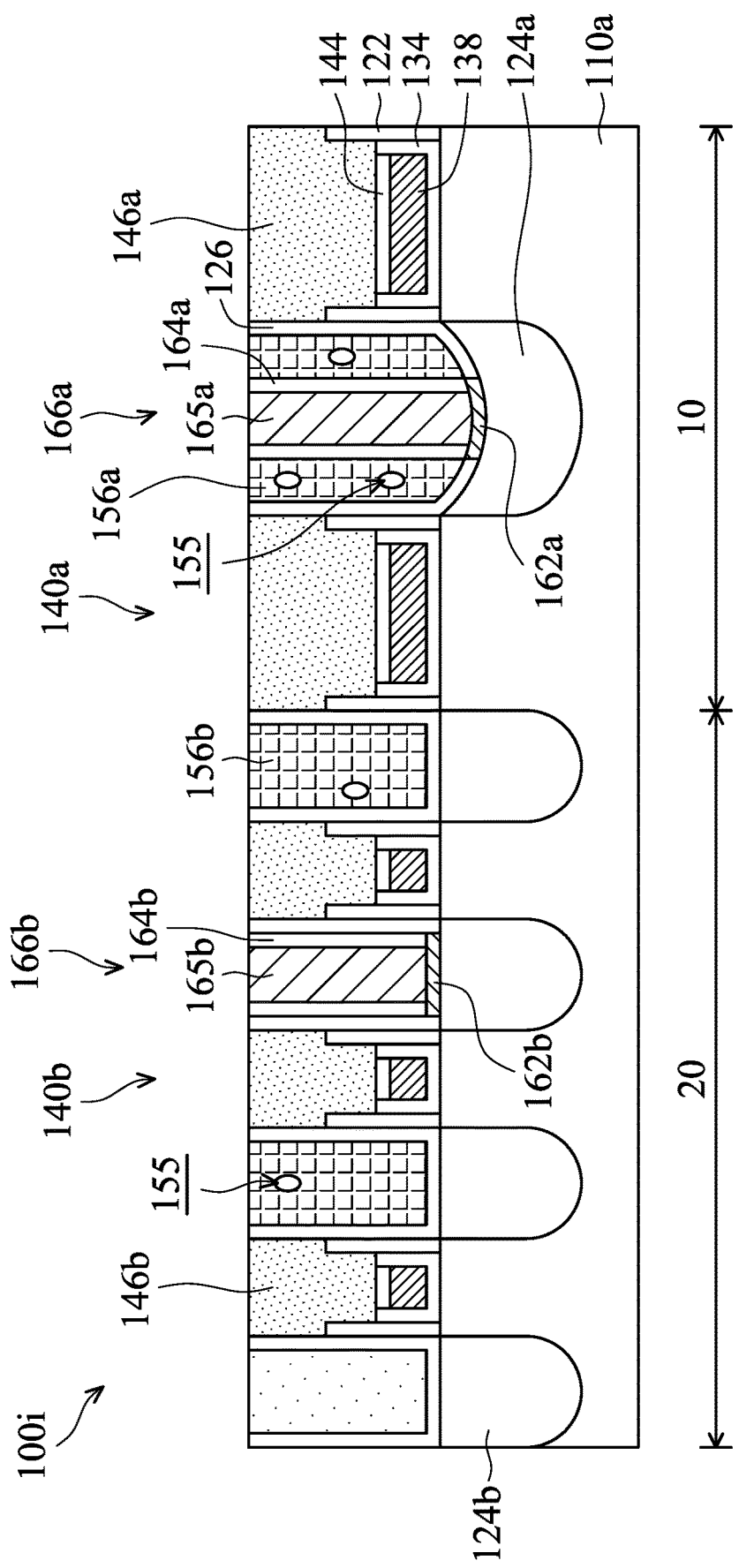
FIG. 12 shows a cross-sectional representation of a modified FinFET device structure, in accordance with some embodiments of the disclosure.

FIG. 12 shows a cross-sectional representation of a modified FinFET device structure 100i, in accordance with some embodiments of the disclosure. The FinFET device structure 100i of FIG. 12 is similar to, or the same as, the FinFET device structure 100b of FIG. 5H, the difference between FIG. 12 and FIG. 5H is that there are some voids 155 in the first filling layer 156a and the second filling layer 156b.

Figure 13:
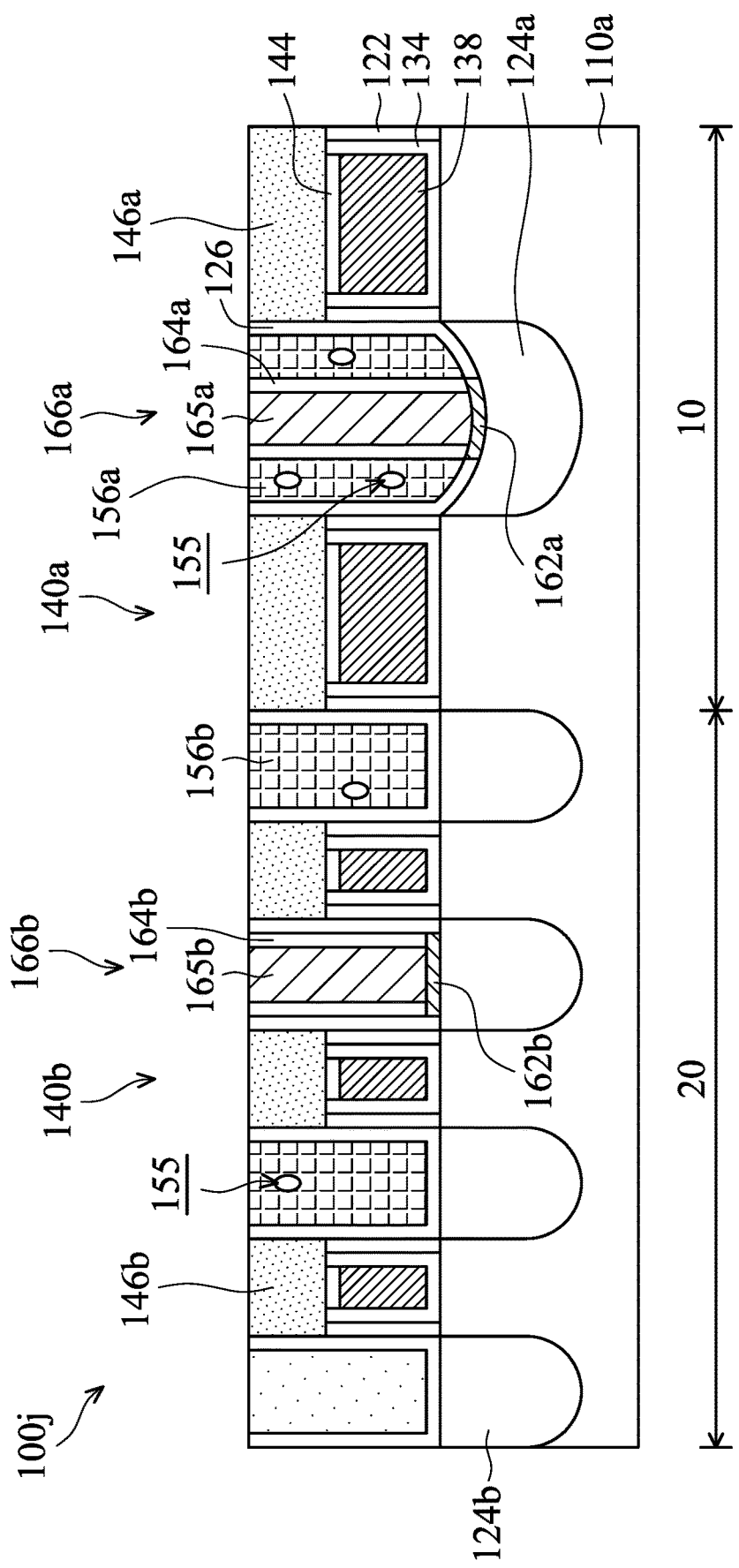
FIG. 13 shows a cross-sectional representation of a modified FinFET device structure, in accordance with some embodiments of the disclosure.

FIG. 13 shows a cross-sectional representation of a modified FinFET device structure 100j, in accordance with some embodiments of the disclosure. The FinFET device structure 100j of FIG. 13 is similar to, or the same as, the FinFET device structure 100i of FIG. 12, the difference between FIG. 13 and FIG. 12 is that the first hard mask layer 146a and the second hard mask layer 146b both have rectangular shape. Materials and methods used to form the semiconductor structure 100j is similar to, or the same as, those used to form the semiconductor structure 100i and are not repeated herein.

Figure 14:
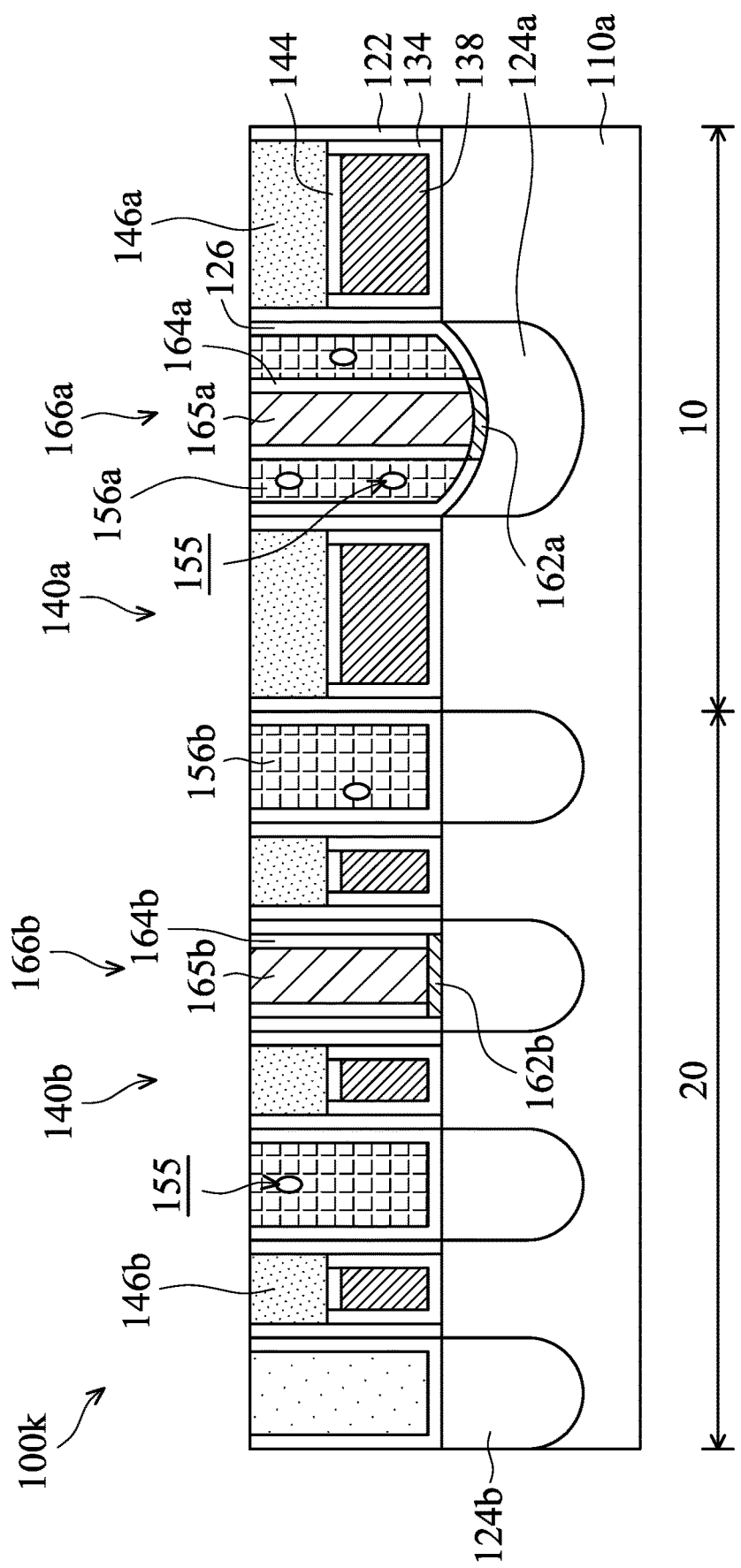
FIG. 14 shows a cross-sectional representation of a modified FinFET device structure, in accordance with some embodiments of the disclosure.

FIG. 14 shows a cross-sectional representation of a modified FinFET device structure 100k, in accordance with some embodiments of the disclosure. The FinFET device structure 100k of FIG. 14 is similar to, or the same as, the FinFET device structure 100i of FIG. 12, the difference between FIG. 14 and FIG. 12 is that the first hard mask layer 146a and the second hard mask layer 146b both have rectangular shape. Materials and methods used to form the semiconductor structure 100k is similar to, or the same as, those used to form the semiconductor structure 100i and are not repeated herein.

Figure 15:
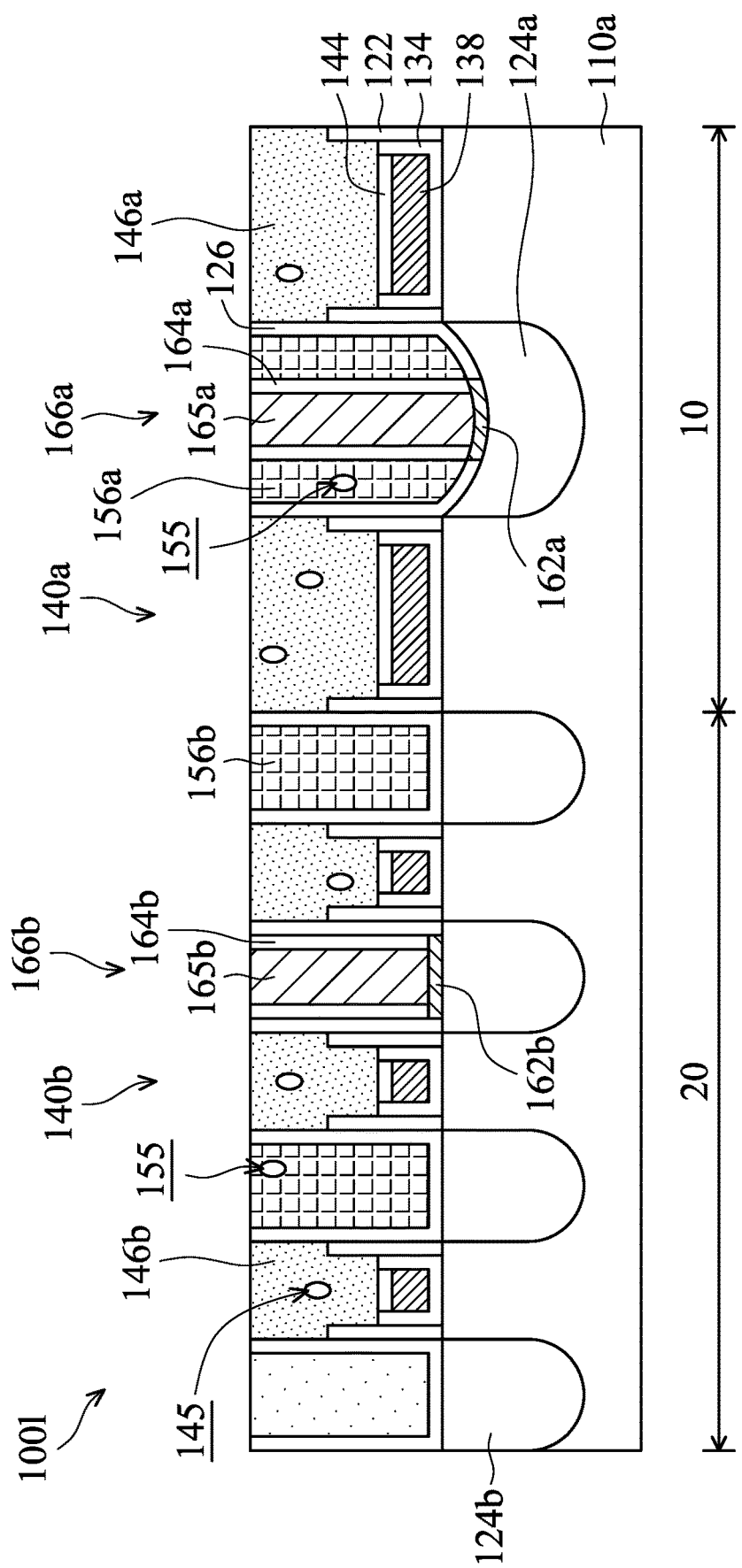
FIG. 15 shows a cross-sectional representation of a modified FinFET device structure, in accordance with some embodiments of the disclosure.

FIG. 15 shows a cross-sectional representation of a modified FinFET device structure 100l, in accordance with some embodiments of the disclosure. The FinFET device structure 100l of FIG. 15 is similar to, or the same as, the FinFET device structure 100b of FIG. 5H, the difference between FIG. 15 and FIG. 5H is that there are some voids 145 in the first hard mask layer 146a and the second hard mask layer 146b, and there are some voids 155 in the first filling layer 156a and the second filling layer 156b.

Figure 16:
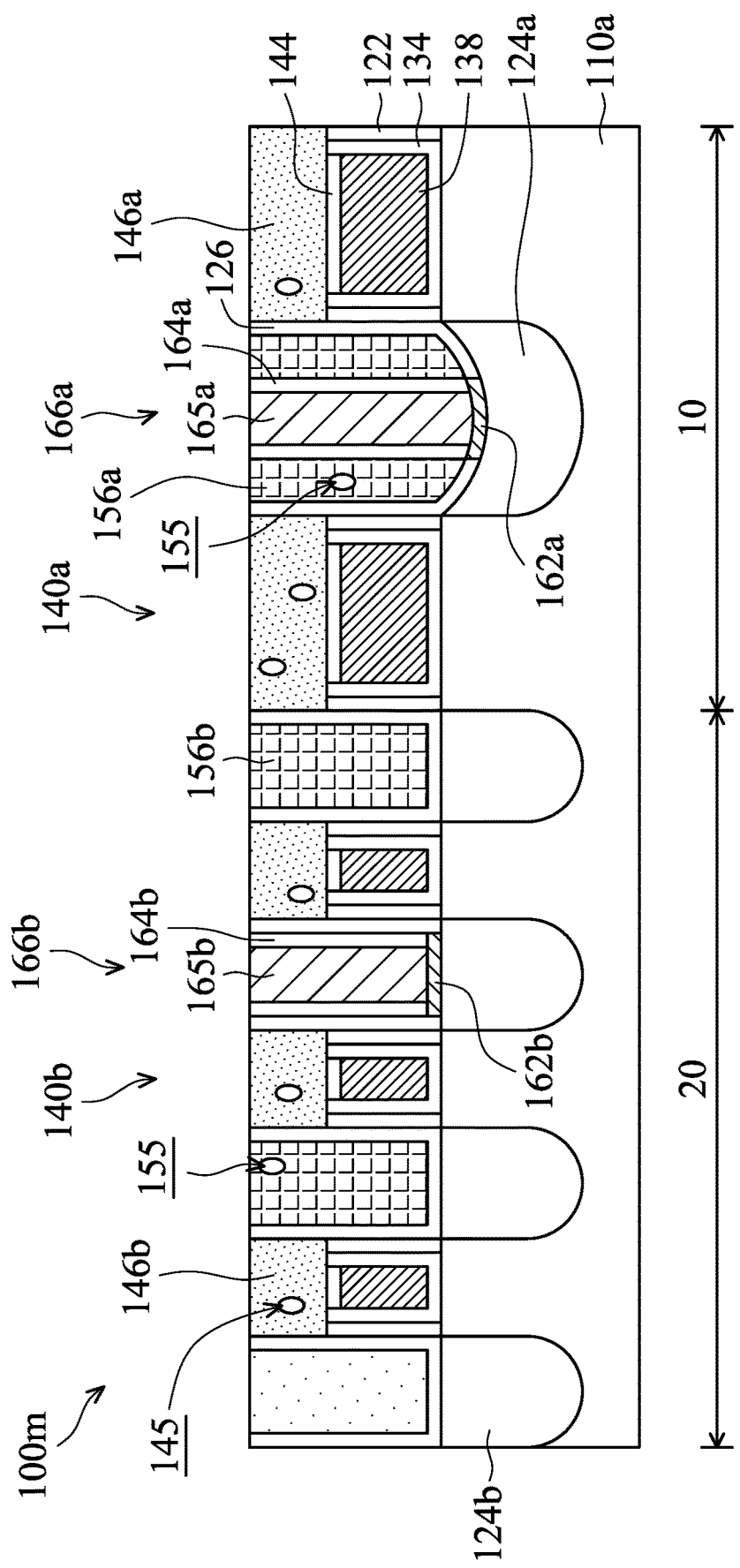
FIG. 16 shows a cross-sectional representation of a modified FinFET device structure, in accordance with some embodiments of the disclosure.

FIG. 16 shows a cross-sectional representation of a modified FinFET device structure 100m, in accordance with some embodiments of the disclosure. The FinFET device structure 100m of FIG. 16 is similar to, or the same as, the FinFET device structure 100l of FIG. 15, the difference between FIG. 16 and FIG. 15 is that the first hard mask layer 146a and the second hard mask layer 146b both have rectangular shape. Materials and methods used to form the semiconductor structure 100m is similar to, or the same as, those used to form the semiconductor structure 100l and are not repeated herein.

Figure 17:
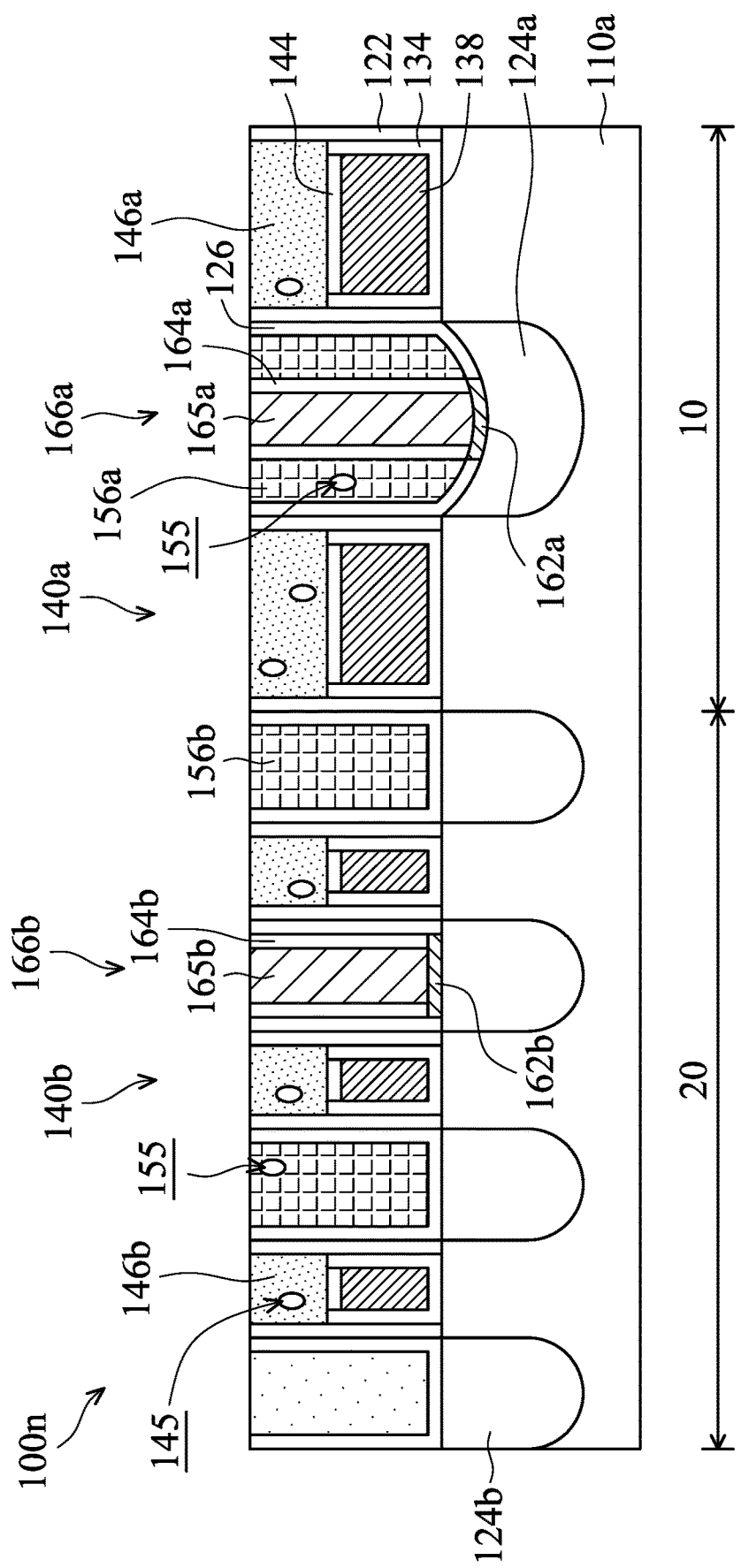
FIG. 17 shows a cross-sectional representation of a modified FinFET device structure, in accordance with some embodiments of the disclosure.

FIG. 17 shows a cross-sectional representation of a modified FinFET device structure 100n, in accordance with some embodiments of the disclosure. The FinFET device structure 100n of FIG. 17 is similar to, or the same as, the FinFET device structure 100l of FIG. 15, the difference between FIG. 17 and FIG. 15 is that the first hard mask layer 146a and the second hard mask layer 146b both have rectangular shape. Materials and methods used to form the semiconductor structure 100n is similar to, or the same as, those used to form the semiconductor structure 100l and are not repeated herein.

Embodiments for forming a semiconductor device structure and method for formation of the same are provided. A gate structure is formed over a fin structure, and a source/drain structure is formed adjacent to the gate structure. A dielectric layer is formed over the gate structure and the S/D structure. A first portion of the dielectric layer is removed to form a recess over the S/D structure, and a filling layer in the recess. Next, a second portion of the dielectric layer is removed to form a trench, and the trench is surrounded by the filling layer. An S/D contact structure is formed in the trench. The second portion of the dielectric layer is removed by the isotropic etching process. In the isotropic etching process, the filling layer has a higher etching selectivity in relating to the dielectric layer, and therefore the filling layer is not removed. In addition, the hard mask layer over the gate structure has a higher etching selectivity in relating to the dielectric layer, and the hard mask layer is not removed. Therefore, the loss of the hard mask layer is prevented, and the leakage of gate structure is reduced. As a result, the performance of the semiconductor device structure is improved.

In some embodiments, a semiconductor device structure is provided. The semiconductor device structure includes a fin structure formed over a substrate, and a gate structure formed over the fin structure. The semiconductor device structure includes a first source/drain (S/D) structure formed adjacent to the gate structure, and a first S/D contact structure formed over the first S/D structure. The semiconductor device structure includes a first filling layer formed over the first S/D structure, and the first S/D contact structure is surrounded by the first filling layer. The semiconductor device structure includes a dielectric layer formed adjacent to the gate structure and the first filling layer, and the dielectric layer and the first filling layer are made of different materials. The first filling layer is surrounded by the dielectric layer.

In some embodiments, a semiconductor device structure is provided. The semiconductor device structure includes a fin structure formed over a substrate, and the substrate comprises a first region and a second region. The semiconductor device structure includes a first source/drain (S/D) structure formed over the first region, and a second S/D structure formed over the second region. The first S/D structure is wider than the second S/D structure. The semiconductor device structure includes a first S/D contact structure formed over the first S/D structure, and a first filling layer surrounding the first S/D contact structure. The semiconductor device structure includes a second filling layer formed over the second S/D structure, and a dielectric layer surrounding the first filling layer. There is an interface between the first filling layer and the dielectric layer, and the interface is parallel to the direction of the fin structure when seen from a top view.

In some embodiments, a method for forming a semiconductor device structure is provided. The method includes forming a fin structure over a substrate, and forming a gate structure over the fin structure. The method includes forming a source/drain (S/D) structure adjacent to the gate structure, and forming a dielectric layer over the gate structure and the S/D structure. The method includes removing a first portion of the dielectric layer to form a recess over the S/D structure, and forming a filling layer in the recess. The method also includes removing a second portion of the dielectric layer to expose a trench, and the trench is surrounded by the filling layer. The method also includes forming an S/D contact structure in the trench, and the S/D contact structure is surrounded by the filling layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
   a fin structure formed over a substrate;
   a gate structure formed over the fin structure;
   a first source/drain (S/D) structure formed adjacent to the gate structure;
   a first S/D contact structure formed over the first S/D structure;
   a first layer formed over the first S/D structure, wherein the first S/D contact structure is surrounded by the first layer, and a portion of the first layer is lower than a bottom surface of the gate structure; and
   a dielectric layer formed adjacent to the gate structure and the first layer, wherein the dielectric layer and the first layer are made of different materials, and the first layer is surrounded by the dielectric layer.

2. The semiconductor device structure as claimed in claim 1, further comprising:
   a gate spacer layer formed on a sidewall of the gate structure, wherein the first layer is surrounded by the gate spacer layer.

3. The semiconductor device structure as claimed in claim 1, wherein the first S/D contact structure is completely surrounded by the first layer.

4. The semiconductor device structure as claimed in claim 1, further comprising:
   a gate spacer layer formed on a sidewall of the gate structure; and
   a protection layer formed over the gate structure, wherein a bottom surface of the protection layer is lower than a top surface of the gate spacer layer.

5. The semiconductor device structure as claimed in claim 4, wherein the gate structure comprises a gate dielectric layer, wherein the protection layer is not formed on a top surface of the gate dielectric layer.

6. The semiconductor device structure as claimed in claim 1, wherein the fin structure is formed along a first direction, there is a first interface between the first layer and the dielectric layer, and the first interface is parallel to the first direction of the fin structure when seen from a top view.

7. The semiconductor device structure as claimed in claim 6, wherein there is a second interface between the first S/D contact structure and the first layer, and the first interface is parallel to the second interface when seen from a top view.

8. The semiconductor device structure as claimed in claim 1, further comprising:
   a second S/D structure formed over the substrate;
   a second layer formed over the second S/D structure; and
   a second S/D contact structure and a third S/D contact structure formed adjacent to the second S/D contact structure, wherein the third S/D contact structure is isolated from the second S/D contact structure by the second layer.

9. The semiconductor device structure as claimed in claim 1, further comprising:
   an etching stop layer formed over the first S/D structure, wherein the first layer is in direct contact with the etching stop layer.

10. The semiconductor device structure as claimed in claim 1, further comprising:
    a hard mask layer formed over the gate structure, wherein the first filling layer is between the hard mask layer and the first S/D contact structure.

11. A semiconductor device structure, comprising:
    a fin structure formed over a substrate, wherein the substrate comprises a first region and a second region;
    a first source/drain (S/D) structure formed over the first region;
    a second S/D structure formed over the second region, wherein a width of the first S/D structure is greater than a width of the second S/D structure;

a first S/D contact structure formed over the first S/D structure;

a first filling layer surrounding the first S/D contact structure;

a second filling layer formed over the second S/D structure; and a dielectric layer surrounding the first filling layer, wherein there is an interface between the first layer and the dielectric layer, and the interface is parallel to a direction of the fin structure when seen from a top view.

12. The semiconductor device structure as claimed in claim 11, wherein a top surface of the first S/D structure is lower than a top surface of the second S/D structure.

13. The semiconductor device structure as claimed in claim 11, wherein a portion of the first S/D contact structure is lower than a top surface of the second S/D structure.

14. The semiconductor device structure as claimed in claim 11, further comprising:
a second S/D contact structure and a third S/D contact structure formed on opposite sidewalls of the second filling layer, and the second S/D contact structure is separated from the third S/D contact structure by the second filling layer.

15. The semiconductor device structure as claimed in claim 14, further comprising:
a gate structure formed over the substrate; and
a hard mask layer formed over the gate structure, wherein the first filling layer is between the hard mask layer and the first S/D contact structure.

16. The semiconductor device structure as claimed in claim 15, wherein a void is formed in the first filling layer.

17. A semiconductor device structure, comprising:
a fin structure formed over a substrate, wherein the substrate comprises a first region and a second region;
a first gate structure formed on the fin structure;
a first hard mask layer formed on the first gate structure;
a first gate spacer layer formed on a sidewall surface of the first gate;
a first source/drain (S/D) structure formed over the first region;
a second S/D structure formed over the second region, wherein a width of the first S/D structure is greater than a width of the second S/D structure;
a first S/D contact structure formed over the first S/D structure;
a first filling layer surrounding the first S/D contact structure, wherein the first gate spacer layer is between the first filling layer and the first mask layer; and
a dielectric layer surrounding the first filling layer and the first mask layer, wherein the dielectric layer and the first filling layer are made of different material.

18. The semiconductor device structure as claimed in claim 17, further comprising:
a second S/D contact structure formed over the second S/D structure, wherein a width of the first S/D contact structure is greater than a width of the second S/D contact structure.

19. The semiconductor device structure as claimed in claim 17, further comprising:
a second gate structure adjacent to the second S/D structure, wherein a width of the first gate structure is greater than a width of the second gate structure; and
a second hard mask layer formed over the second gate structure, wherein a width of the first hard mask layer is greater than a width of the second hard mask layer.

20. The semiconductor device structure as claimed in claim 19, wherein the second hard mask layer is surrounded by the dielectric layer.

* * * * *